(12) United States Patent
Fang et al.

(10) Patent No.: US 12,183,304 B2
(45) Date of Patent: Dec. 31, 2024

(54) DISPLAY PANEL AND METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Fei Fang, Beijing (CN); Ke Liu, Beijing (CN); Ling Shi, Beijing (CN); Ruoxiang Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/275,807

(22) PCT Filed: Aug. 9, 2022

(86) PCT No.: PCT/CN2022/111019
§ 371 (c)(1),
(2) Date: Aug. 4, 2023

(87) PCT Pub. No.: WO2023/020326
PCT Pub. Date: Feb. 23, 2023

(65) Prior Publication Data
US 2024/0119914 A1 Apr. 11, 2024

(30) Foreign Application Priority Data
Aug. 16, 2021 (CN) .......................... 202110939190.3

(51) Int. Cl.
*G09G 5/00* (2006.01)

(52) U.S. Cl.
CPC .......... *G09G 5/003* (2013.01); *G09G 2300/02* (2013.01); *G09G 2310/0208* (2013.01); *G09G 2310/0243* (2013.01); *G09G 2360/14* (2013.01)

(58) Field of Classification Search
CPC ....... G09G 2310/0243; G09G 2360/14; G09G 3/32; G09G 2300/0426; H10K 59/131; G02F 1/136295
See application file for complete search history.

(56) References Cited

U.S. PATENT DOCUMENTS

2016/0372074 A1 12/2016 Fukami et al.
2017/0194390 A1* 7/2017 Kim ...................... H10K 50/11
(Continued)

FOREIGN PATENT DOCUMENTS

| CN | 111916486 A | 11/2020 |
|----|-------------|---------|
| CN | 112445038 A | 3/2021  |

(Continued)

OTHER PUBLICATIONS

China National Intellectual Property Administration, First office action of Chinese application No. 202110939190.3 issued on Oct. 30, 2024, which is foreign counterpart application of this U.S. application, total 18 pages.

*Primary Examiner* — Priyank J Shah
(74) *Attorney, Agent, or Firm* — XSENSUS LLP

(57) ABSTRACT

Provided is a display panel. The display panel includes: a base substrate, including a display region and a periphery region at least partially surrounding the display region, wherein the display region includes a first display region and a second display region disposed at least on one side of the first display region, a light transmittance of the first display region being greater than a light transmittance of the second display region; a plurality of first pixel units disposed on the base substrate and in the first display region; and a plurality (Continued)

of signal lines disposed at least in the first display region and electrically connected to the plurality of first pixel units, wherein the plurality of signal lines include a plurality of first signal lines and a plurality of second signal lines.

18 Claims, 23 Drawing Sheets

(56) References Cited

U.S. PATENT DOCUMENTS

| | | | |
|---|---|---|---|
| 2021/0335221 A1* | 10/2021 | Ma | H10K 59/131 |
| 2022/0077265 A1* | 3/2022 | Ma | H10K 59/1213 |
| 2022/0173195 A1* | 6/2022 | Liu | G02F 1/136286 |
| 2022/0285476 A1* | 9/2022 | Li | H10K 50/865 |
| 2023/0230528 A1* | 7/2023 | Liu | G09G 3/20 |
| | | | 345/84 |
| 2023/0269985 A1 | 8/2023 | Chen et al. | |
| 2024/0087513 A1* | 3/2024 | Nakamura | H10K 59/131 |

FOREIGN PATENT DOCUMENTS

| | | |
|---|---|---|
| CN | 113053982 A | 6/2021 |
| CN | 113096581 A | 7/2021 |
| CN | 113224123 A | 8/2021 |
| CN | 216389369 U | 4/2022 |

* cited by examiner

DISPLAY PANEL AND METHOD FOR MANUFACTURING SAME, AND DISPLAY DEVICE

CROSS-REFERENCE TO RELATED APPLICATIONS

This application is a U.S. national stage of international application No. PCT/CN2022/111019, filed on Aug. 9, 2022, which claims priority to Chinese Patent Application No. 202110939190.3, filed on Aug. 16, 2021 and entitled "DISPLAY PANEL AND MANUFACTURING METHOD THEREFOR, AND DISPLAY DEVICE," the disclosures of each are incorporated herein by references in their entireties.

TECHNICAL FIELD

The present disclosure relates to the field of display technologies, and in particular, relates to a display panel and a method for manufacturing the same, and a display device.

BACKGROUND

Bezel-less display devices have a great screen-to-body ratio, and thus exert a great view effect. For improvement of the screen-to-body ratio of the bezel-less display device, the under display camera technology has been increasingly developed in the display device, such as a mobile phone.

The bezel-less display device includes a display panel and a full display camera (FDC). The display panel includes a camera display region disposed with the pixel units, such that the camera display region is capable of displaying screens. The FDC is disposed under the display panel, and is opposite to the camera display region.

SUMMARY

Embodiments of the present disclosure provide a display panel and a method for manufacturing the same, and a display device. The technical solutions are as follows.

In some embodiments of the present disclosure, a display panel is provided. The display panel includes: a base substrate, including a display region and a periphery region at least partially surrounding the display region, wherein the display region includes a first display region and a second display region disposed at least on one side of the first display region, a light transmittance of the first display region being greater than a light transmittance of the second display region; a plurality of first pixel units disposed on the base substrate and in the first display region; and a plurality of signal lines disposed at least in the first display region and electrically connected to the plurality of first pixel units, wherein the plurality of signal lines include a plurality of first signal lines and a plurality of second signal lines, wherein a first portion of each of the plurality of first signal lines is a metal signal line and is disposed at least in the first display region, and a first portion of each of the plurality of second signal lines is a metal oxide signal line and is disposed at least in the first display region.

In some embodiments, the plurality of first signal lines include at least one of: a gate signal line, a data signal line, a reset signal line, a light-emitting control signal line, an initiation voltage signal line, and a power signal line.

In some embodiments, the plurality of first signal lines include the gate signal line and the data signal line.

In some embodiments, at least one of the plurality of first signal lines further includes a second portion in the second display region, and at least one of the plurality of second signal lines further includes a second portion in the second display region, wherein both the second portion of at least one of the plurality of first signal lines and the second portion of at least one of the plurality of second signal lines are metal signal lines.

In some embodiments, the display panel further includes: a first metal layer, a first insulative layer, and a metal oxide layer that are sequentially disposed on the base substrate in a direction away from the base substrate, wherein the plurality of first signal lines are disposed in the first metal layer, the first portion, in the first display region, of at least one of the plurality of second signal lines is disposed in the metal oxide layer, the second portion, in the second display region, of at least one of the plurality of second signal lines is disposed in the first metal layer, and the first portion and the second portion of the at least one of the plurality of second signal lines are connected by a first via opened through the first insulative layer, wherein the first via is at a junction of the first display region and the second display region.

In some embodiments, the first metal layer includes a first gate metal layer and a first source and drain metal layer, and the first insulative layer includes a first passivation layer and an inter-layer dielectric layer, wherein the first gate metal layer, the inter-layer dielectric layer, the first source and drain metal layer, and the first passivation layer are sequentially laminated in the direction away from the base substrate.

In some embodiments, the display panel further includes: a second insulative layer and a second metal layer, wherein the second metal layer, the second insulative layer, the first metal layer, the first insulative layer, and the metal oxide layer are sequentially laminated in the direction away from the base substrate, the first portions, in the first display region, of another part of the plurality of second signal lines are disposed in the metal oxide layer, the second portions, in the second display region, of the another part of the plurality of second signal lines are disposed in the second metal layer, and the first portions and the second portions of the another part of the plurality of second signal lines are connected by a second via opened through the first insulative layer and the second insulative layer, wherein the second via is at the junction of the first display region and the second display region.

In some embodiments, the second metal layer includes a second gate metal layer, and the second insulative layer includes a first gate insulative layer.

In some embodiments, in a case that a ratio of a first size of the first display region to a second size of the first display region is greater than 2, the plurality of first signal lines are gate signal lines, wherein the first size of the first display region is a size of the first display region in an extension direction of the gate signal lines, and the second size of the first display region is a size of the first display region in an extension direction of data signal lines.

In some embodiments, in a case that a ratio of a first size of the first display region to a second size of the first display region is less than 0.5, the plurality of first signal lines are data signal lines, wherein the first size of the first display region is a size of the first display region in an extension direction of gate signal lines, and the second size of the first display region is a size of the first display region in an extension direction of the data signal lines.

In some embodiments, in a case that a ratio of a first size of the first display region to a second size of the first display region is in a range from 0.5 to 2, the plurality of first signal lines include a gate signal line and a data signal line, wherein the first size of the first display region is a size of the first display region in an extension direction of the gate signal line, and the second size of the first display region is a size of the first display region in an extension direction of the data signal line.

In some embodiments, the display panel further includes: a plurality of second pixel units in the second display region, wherein the plurality of first pixel units and the plurality of second pixel units are arranged in a plurality of rows, pixel units in two adjacent rows of pixel units are staggered in an arrangement direction of one row of pixel units, and the pixel units in two adjacent rows of pixel units are connected by one gate signal line.

In some embodiments, the gate signal line is wavy, and peaks of wave and valleys of wave of the gate signal line are respectively connected to the pixel units in adjacent two rows of pixel units.

In some embodiments, the data signal line is wavy, and peaks of wave and valleys of wave of the data signal line are respectively connected to two adjacent pixel units in the same column of pixel units.

In some embodiments, the metal signal line includes a molybdenum-containing signal line and a titanium-containing signal line.

In some embodiments, the metal oxide signal line is a transparent metal oxide signal line.

In some embodiments, the metal oxide signal line is an indium tin oxide signal line.

In some embodiments of the present disclosure, a method for manufacturing a display panel is provided. The method includes:

providing a base substrate, wherein the base substrate includes a display region and a periphery region at least partially surrounding the display region, wherein the display region includes a first display region and a second display region disposed at least on one side of the first display region, a light transmittance of the first display region being greater than a light transmittance of the second display region; and forming a plurality of first pixel units and a plurality of signal lines on the base substrate, and the plurality of first pixel units are disposed in the first display region, the plurality of signal lines are disposed at least in the first display region and electrically connected to the plurality of first pixel units, and the plurality of signal lines include a plurality of first signal lines and a plurality of second signal lines, wherein a first portion of each of the plurality of first signal lines is a metal signal line and is disposed at least in the first display region, and a first portion of each of the plurality of second signal lines is a metal oxide signal line and is disposed at least in the first display region.

In some embodiments of the present disclosure, a display device is provided in the present disclosure. The display device includes: a power supply assembly and the display panel in any one of the above embodiments, wherein the power supply assembly is configured to supply power to the display panel.

In some embodiments, the display device further includes: a photosensor, wherein the photosensor is disposed on a side, distal from the plurality of first pixel units, of the display panel, and an orthogonal projection of the photosensor on the base substrate is at least partially overlapped with the first display region.

BRIEF DESCRIPTION OF DRAWINGS

For clearer description of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

REFERENCE NUMERALS AND DENOTATIONS THEREOF

100—display region; 200—periphery region; 10—base substrate; 101—first display region; 102—second display region; 20—pixel unit; 30—signal line; 301—first signal line; 302—second signal line; 201—first metal layer; 202—first insulative layer; 203—metal oxide layer; 221—first via; 211—first gate metal layer; 212—first source and drain metal layer; 222—first passivation layer; 223—inter-layer dielectric layer; 204—second insulative layer; 205—second metal layer; 241—second via; 251—second gate metal layer; 242—first gate insulative layer; 206—active layer; 207—second gate insulative layer; 208—second passivation layer; 209—second source and drain metal layer; 2010—buffer layer; 2011—planarization layer; 2012—anode layer; 2013—pixel defining layer; 2014—spacer layer; 2015—light-emitting layer; 2016—cathode layer; 2017—first inorganic package layer; 2018—organic package layer; 2019—second inorganic package layer; L1—first size; L2—second size; 40—second pixel unit; 50—photosensor; 60—capacitor; 601—first electrode plate; 602—second electrode plate.

DETAILED DESCRIPTION

For clearer descriptions of the objectives, technical solutions, and advantages of the present disclosure, the embodiments of the present disclosure are described in detail hereinafter with reference to the accompanying drawings.

In some practices, for improvement of the light transmittance of the camera display region and receiving of enough light by the FDC for imaging, signal lines between pixel units in the camera display region are transparent metal oxide signal lines, for example, indium tin oxide (ITO) signal lines.

The great resistance of the metal oxide signal line may cause the great loading, such that the voltage received by the pixel units connected to the metal oxide signal lines is less than the voltage received by the pixel units in other display regions. Thus, a difference between the display effect of the camera display region and the display effect of the other display regions is great, and thus the display is nonuniform.

Figure 1:
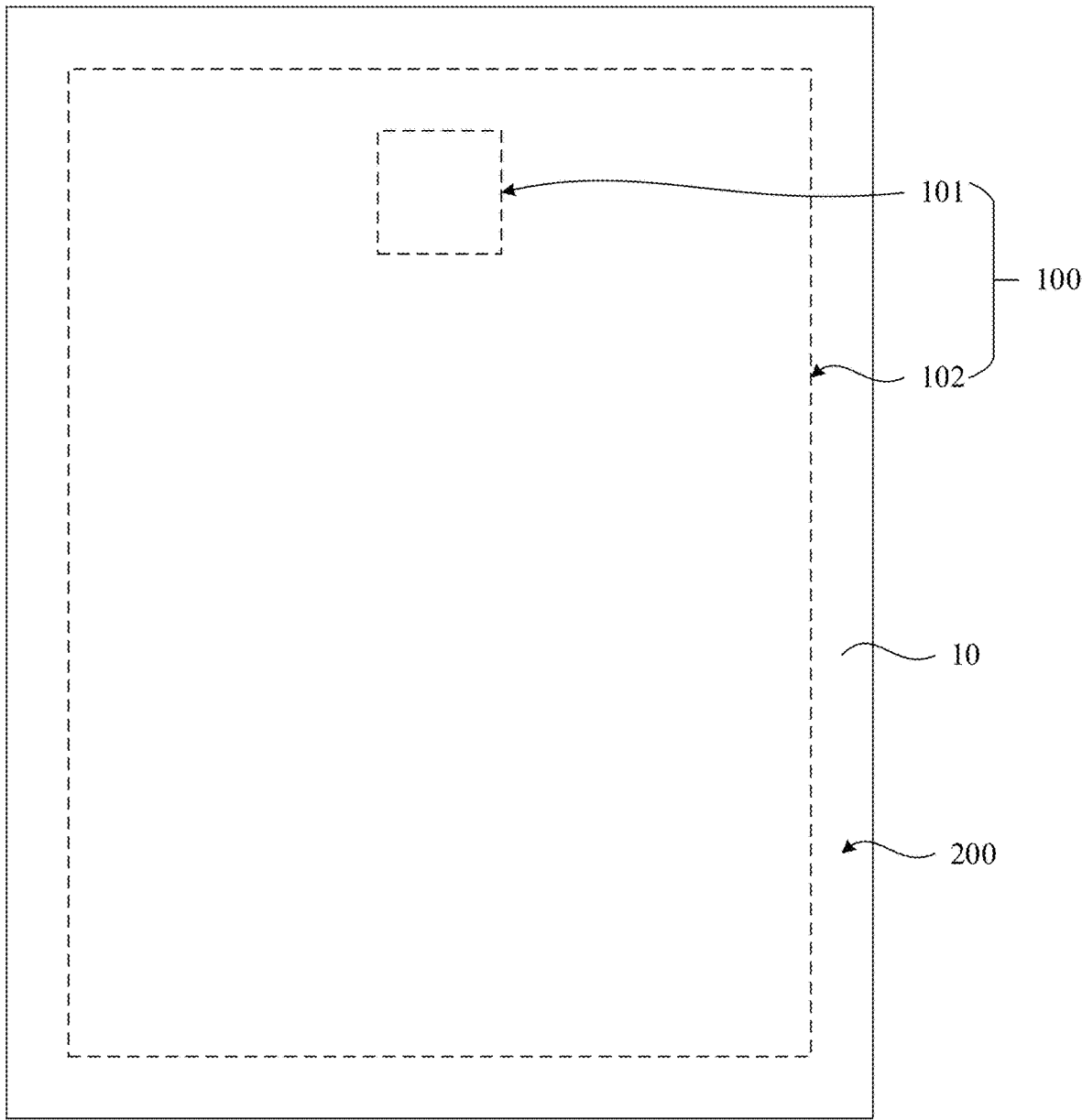
FIG. 1 is a schematic planar diagram of a display panel according to some embodiments of the present disclosure.

FIG. 1 is a schematic planar diagram of a display panel according to some embodiments of the present disclosure. Referring to FIG. 1, the display panel includes a base substrate 10. The base substrate 10 includes a display region 100 and a periphery region 200 at least partially surrounding the display region 100. The display region 100 is configured to be disposed with the pixel circuit, and the periphery 200 is configured to be disposed with the integrated circuit. The integrated circuit is configured to drive the pixel circuit to operate. Illustratively, the periphery region 200 at least partially surrounding the display region 100 indicates that the periphery region 200 surrounds the display region 100; two sides of the display region 100 are connected to the periphery region 200; or the periphery region 200 and the display region 100 are juxtaposed, and one side of the display region 100 is connected to the periphery region 200.

The display region 100 includes a first display region 101 and a second display region 102 disposed at least on one side of the first display region 101, and a light transmittance of the first display region 101 is greater than a light transmittance of the second display region 102. The light transmittance of the first display region 101 is great, such that a hole digging process is not required to be performed on the base substrate 10, the hardware structure, such as the photosensor and the like is directly disposed at a position opposite to the first display region 101, and a real bezel-less display device is achieved. Illustratively, the photosensor is a camera.

In FIG. 1, the first display region 101 is in a rectangular shape. In some embodiments, the first display region 101 is in a circular shape, a polygonal shape, or other regular or irregular shapes.

Illustratively, the second display region 102 disposed at least on one side of the first display region 101 indicates that the second display region 102 surrounds the first display region 101; two sides of the first display region 101 are connected to the second display region 102; or the first display region 101 and the second display region 102 are juxtaposed, and one side of the first display region 101 is connected to the second display region 102.

Referring to FIG. 1, the second display region 102 surrounds the first display region 101. Illustratively, the first display region 101 is disposed at a center position of a top region of the base substrate 10.

In some embodiments, the first display region 101 is disposed at other positions of the base substrate 10. For example, in conjunction with FIG. 1, the first display region 101 is disposed at an upper left corner or an upper right corner.

Figure 2:
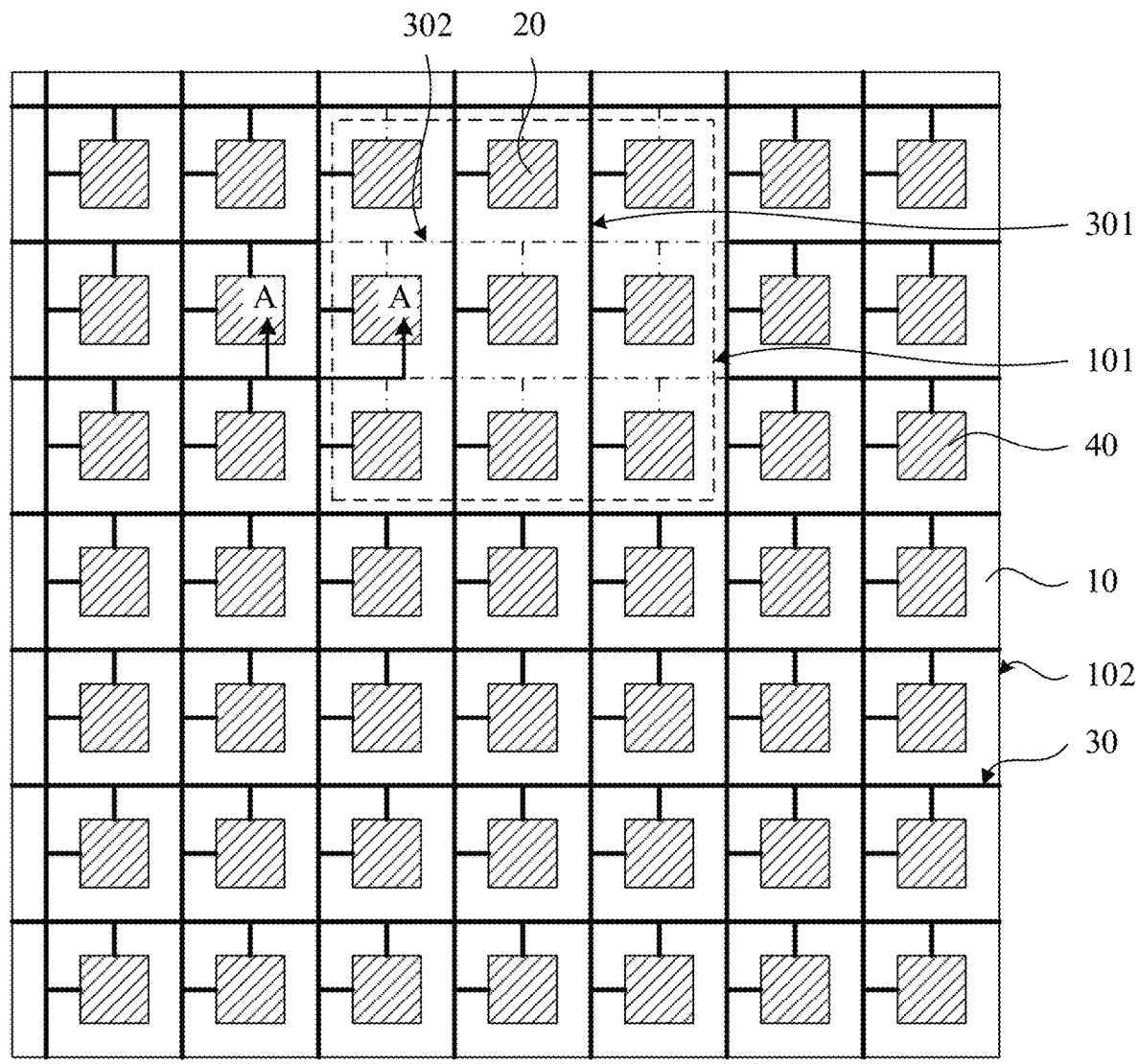
FIG. 2 is a schematic structural diagram of a display panel according to some embodiments of the present disclosure.

FIG. 2 is a schematic structural diagram of a display panel according to some embodiments of the present disclosure. Referring to FIG. 2, the display panel further includes a plurality of first pixel units 20 and a plurality of signal lines 30. The plurality of first pixel units 20 are disposed on the base substrate 10 and in the first display region 101, and the plurality of signal lines 30 are disposed at least in the first display region 101 and electrically connected to the plurality of first pixel units 20.

Figure 3:
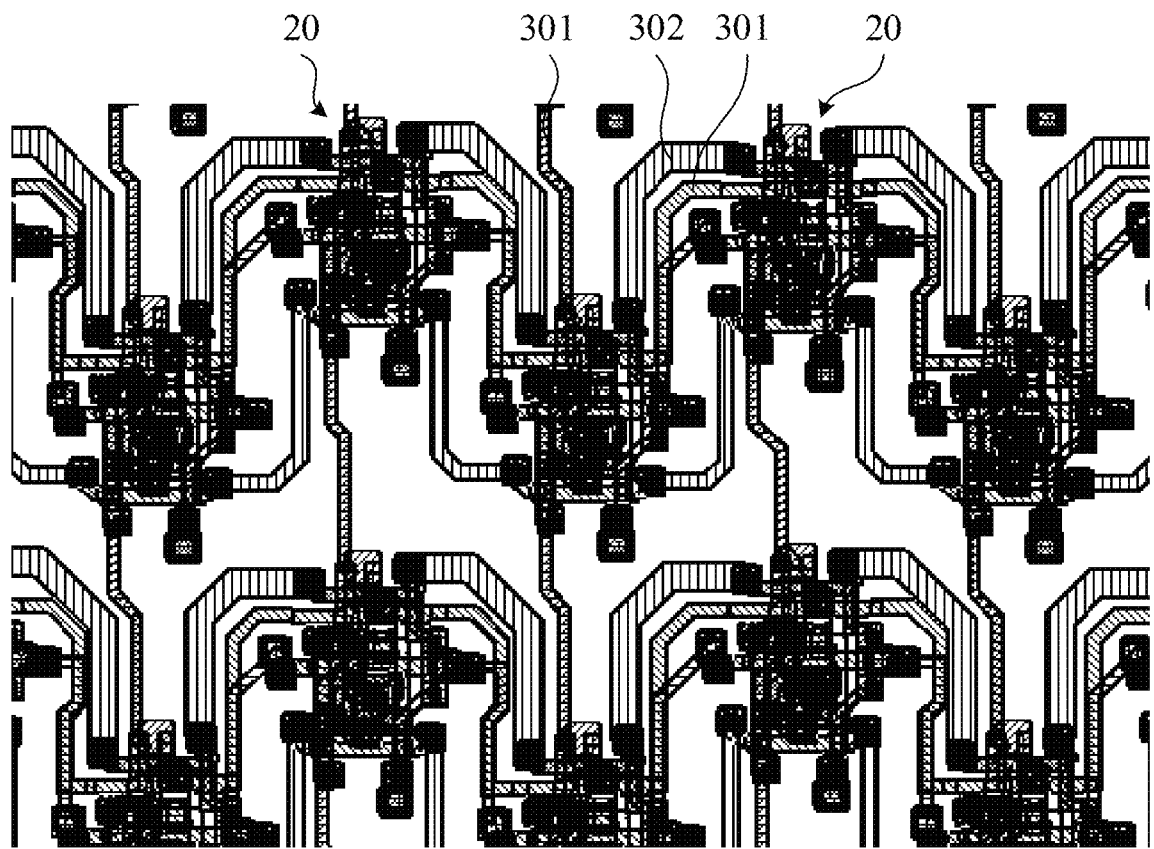
FIG. 3 is a schematic structural diagram of a display panel according to some embodiments of the present disclosure.

FIG. 3 is a schematic structural diagram of a display panel according to some embodiments of the present disclosure. Referring to FIG. 3, the plurality of signal lines 30 include a plurality of first signal lines 301 and a plurality of second signal lines 302. For example, the plurality of first signal lines 301 include a gate signal line and a data signal line, and the plurality of second signal lines 302 include a reset signal line. The plurality of first pixel units 20 are arranged in a plurality of rows, pixel units in two adjacent rows are staggered in an arrangement direction of one row of pixel units, and the pixel units in two adjacent rows are connected by one first signal line 301 or one second signal line 302. Both the first signal line 301 and the second signal line 302 are wavy.

A first portion of each of the plurality of first signal lines 301 is a metal signal line and is disposed at least in the first display region 101, and a first portion of each of the plurality of second signal lines 302 is a metal oxide signal line and is disposed at least in the first display region 101.

In the embodiments of the present disclosure, the light transmittance of the first display region 101 is great, and the photosensor (for example, a bezel-less camera) is disposed in a region corresponding to the first display region 101, such that light is transmitted through the first display region 101 and propagated to the photosensor. The first portion of the first signal line 301 in the first display region 101 is the metal signal line. As a resistance of a metal is less than a resistance of a metal oxide, a loading of the first signal line is reduced in the case that a resistance of the first signal line 301 is reduced, such that a voltage received by the pixel unit 20 in the first display region 101 is increased, a difference between the voltage received by the pixel unit 20 in the first display region 101 and a voltage received by the pixel unit 20 in other regions is less, and the display nonuniformity is solved. The first portion of the second signal line 302 is the metal oxide signal line to ensure the light transmittance of the first display region 101.

Meanwhile, as the first pixel units 20 in the first display region 101 are regularly arranged, gaps between the pixel units 20 are regularly arranged, and light is prone to diffraction in passing through the gaps in the first display region 101. The diffracted light is then propagated to the bezel-less camera, such that the shooting effect of the bezel-less camera is affected. In the embodiments of the present disclosure, the first portion of each first signal line 301 in the first display region 101 is the metal signal line that is not transparent, such that the regular arrangement of the gaps between the pixel units 20 is changed, the diffraction of the light is reduced, and the shooting effect of the bezel-less camera is improved.

In the embodiments of the present disclosure, the first signal line 301 further includes a second portion in the second display region 102, and the second signal line 302 further includes a second portion in the second display region 102. Both the second portion of the first signal line 301 and the second portion of the second signal line 302 are the metal signal lines.

In the embodiments of the present disclosure, it is not necessary to dispose the photosensor in the second display region 102, and thus the light transmittance of the second display region 102 does not require to be great. By disposing the first signal line 301 and the second signal line 302 in the second display region 102 as the metal signal lines, the loading of the first signal line 301 and the loading of the second signal line 302 are reduced, a display luminance of the display panel is improved, and the display effect is improved.

In the embodiments of the present disclosure, the first portion of each of the plurality of second signal lines 302 is a transparent metal oxide signal line, such that part of the signal lines 30 in the first display region 101 is transparent signal lines, and the light transmittance of the first display region 101 is ensured.

In some embodiments, the first signal lines 301 include at least one of the gate signal line and the data signal line.

Each first pixel unit 20 includes a switch transistor and a driving transistor, the gate signal line is configured to supply a conducted voltage to a gate of the switch transistor, and the data signal line is configured to supply a conducted voltage to a gate of the driving transistor. As the resistance of the transparent metal oxide signal line is great, the transparent metal oxide signal line causes a less conducted voltage, such that the switch transistor is not conducted or a conducted duration of the switch transistor is short, a luminance is not coincided with that of a region including the metal signal line, and the display uniformity of the display panel is affected. In the embodiments of the present disclosure, by replacing at least one of the gate signal line and the data signal line in the first display region 101 with the metal signal line, the resistance of the gate signal line or the data signal line is reduced, the conducted voltage of the first pixel unit 20 in the first display region 101 is improved, and the display uniformity is improved.

Illustratively, the metal oxide signal line is an indium tin oxide signal line, and a transparency of the indium tin oxide is great, such that a transparency of the metal oxide signal line is ensured.

Referring to FIG. 2, the display panel further includes a plurality of second pixel units 40 disposed in the second display region 102. The plurality of second pixel units 40 and the plurality of first pixel units 20 are arranged in a plurality of rows.

As a light transmittance of the first pixel unit 20 and a light transmittance of the second pixel unit 40 are less, a size of the first pixel unit 20 is less than a size of the second pixel unit 40 in manufacturing, such that the light transmittance of the first display region 101 is improved.

In some embodiments of the present disclosure, the signal lines 30 further include a reset signal line (Reset), a light-emitting control signal line (EM), an initiation voltage signal line (Vinit), and a power signal line (VDD). The signal lines 30 are the second signal liens 302 other than the first signal lines 301, that is, the reset signal line, the light-emitting control signal line, the initiation voltage signal line, and the power signal line are all second signal lines 302.

The metal signal line has a less resistance and a less light transmittance, and the transparent metal oxide signal line has a great resistance and a great light transmittance. As the photosensor is disposed in a region corresponding to the first display region 101 in the display device, the light transmittance of the first display region 101 requires to be ensured in the case of reducing the resistance of the signal line in the first display region 101. Upon experiment simulation, it is found that the reset signal line, the light-emitting control signal line, the initiation voltage signal line, the power signal line, and the like have a less effect on the display luminance, and thus the light transmittance of the first display region 101 is ensured by disposing the signal lines as the transparent metal oxide signal lines.

In some embodiments of the present disclosure, the first signal lines 301 include the gate signal line and the data signal line, and the second signal lines 302 include the reset signal line, the light-emitting control signal line, the initiation voltage signal line, and the power signal line.

In some embodiments of the present disclosure, the gate signal line includes a molybdenum-containing signal line, and the data signal line includes a titanium-containing signal line.

In some practices, the first portion of the first signal line passing through the first display region is made of the metal oxide. In the embodiments of the present disclosure, the first portion of the first signal line passing through the first display region is made of the metal, such that the first signal line passing through the first display region and the first signal line not passing through the first display region are made in the same manner. That is, the whole signal line is disposed in the same layer.

Figure 4:
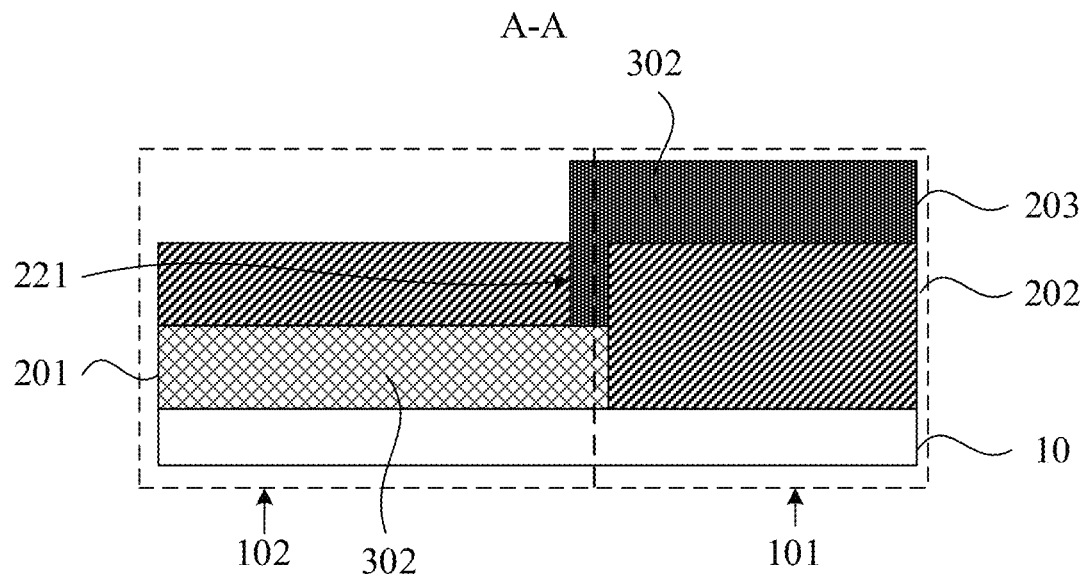
FIG. 4 is a section view of an A-A plane in FIG. 2.

FIG. 4 is a section view of an A-A plane in FIG. 2. Referring to FIG. 4, the display panel further includes a first metal layer 201, a first insulative layer 202, and a metal oxide layer 203 that are sequentially disposed on the base substrate 10 in a direction away from the base substrate 10. The plurality of first signal lines 301 (not shown in FIG. 4) are disposed in the first metal layer 201, the first portion, in the first display region 101, of at least one of the plurality of second signal lines 302 in the first display region 101 is disposed in the metal oxide layer 203, the second portion, in the second display region 102, of at least one of the plurality of second signal lines 302 is disposed in the first metal layer 201, and the first portion and the second portion of the at least one of the plurality of second signal lines 302 are connected by a first via 221 opened through the first insulative layer 202. The first via 221 is at a junction of the first display region 101 and the second display region 102. The junction of the first display region 101 and the second display region 102 is a region of a boundary at which the first display region 101 is connected to the second display region 102. At least one of the plurality of second signal lines 302 refers to one second signal line 302, multiple second signal lines 302, or all of the plurality of second signal lines 302.

In some embodiments of the present disclosure, the first signal line 301 is the metal signal line and is disposed in the first metal layer 201, a portion of the second signal line 302 in the first display region 101 is the transparent metal oxide signal line, and a portion of the second signal line 302 in the second display region 102 is the metal line. The second signal line 302 in the first display region 101 is disposed in the metal oxide layer 203, such that the light transmittance of the first portion of the second signal line 302 is ensured. The second signal line 302 in the second display region 102 is disposed in the first metal layer 201, such that the resistance of the second portion of the second signal line 302 is reduced. The first portion and the second portion of the second signal line 302 are connected by the first via 221 to ensure the validity of the electrical connection.

In the embodiments of the present disclosure, the first metal layer 201 includes a first gate metal layer and a first source and drain metal layer, and the first insulative layer 202 includes a first passivation layer and an inter-layer dielectric layer.

Illustratively, the first signal line 301 includes one of the gate signal line and the data signal line, and the second signal line 302 includes the other of the gate signal line and the data signal line. For example, the first signal line 301 is the gate signal line, the second signal line 302 is the data signal line, the gate signal line is disposed in a first gate metal layer 211, the data signal line in the first display region 101 is disposed in the metal oxide layer 203, and the data signal line in the second display region 102 is disposed in the first source and drain metal layer 212.

Figure 5:
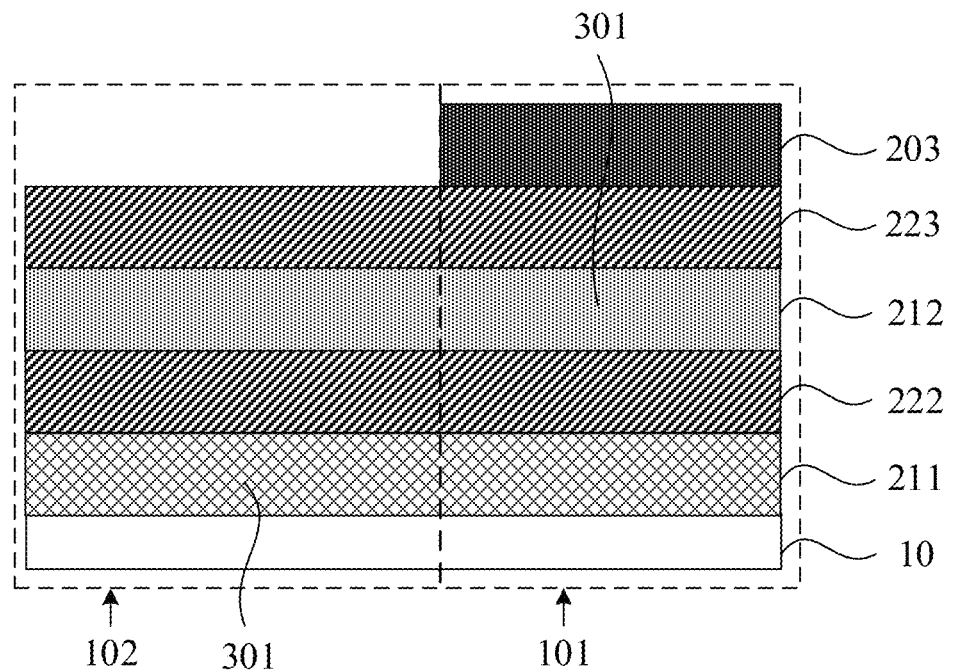
FIG. 5 is a schematic structural diagram of a display panel according to some embodiments of the present disclosure.

FIG. 5 is a schematic structural diagram of a display panel according to some embodiments of the present disclosure. FIG. 4 and FIG. 5 are section views at different sections. Referring to FIG. 5, the display panel includes the first gate metal layer 211, the first passivation layer 222, the first source and drain metal layer 212, the inter-layer dielectric layer 223, and the metal oxide layer 203 that are disposed on the base substrate 10 in a direction away from the base substrate 10. In this case, the display panel only includes one layer of gate metal layer and one layer of the source and drain metal layer. The above first metal layer 201 includes the first gate metal layer 211 and the first source and drain metal layer 212, and the above first insulative layer 202 includes the first passivation layer 222 and the inter-layer dielectric layer 223. The first signal lines 301 include the gate signal line and the data signal line. In the first display region 101 and the second display region 102, the gate signal line is disposed in the first gate metal layer 211. In the first display region 101 and the second display region 102, the data signal line is disposed in the first source and drain metal layer 212. FIG. 5 only shows the first signal line 301.

Figure 6:
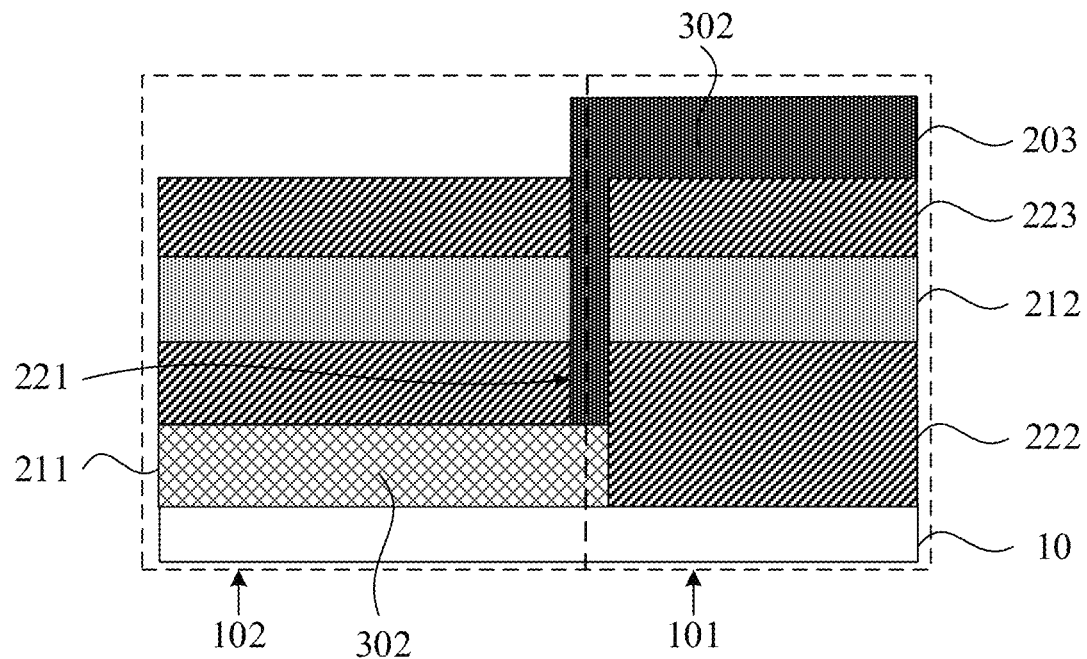
FIG. 6 is a schematic structural diagram of a display panel according to some embodiments of the present disclosure.

FIG. 6 is a schematic structural diagram of a display panel according to some embodiments of the present disclosure. Referring to FIG. 6, the display panel includes the first gate metal layer 211, the first passivation layer 222, the first source and drain metal layer 212, the inter-layer dielectric layer 223, and the metal oxide layer 203. In the direction away from the base substrate 10, the first gate metal layer 211, the first passivation layer 222, the first source and drain metal layer 212, the inter-layer dielectric layer 223, and the metal oxide layer 203 are sequentially laminated.

Illustratively, the second signal lines 302 include the initiation voltage signal line. In the first display region 101, the second signal line 302 is disposed in the metal oxide layer 203. In the second display region 102, the second signal line 302 is disposed in the first gate metal layer 211. FIG. 6 only shows the second signal line 302.

Illustratively, the second signal lines 302 further include the reset signal line and the light-emitting control signal line. In the second display region 102, the reset signal line and the light-emitting control signal line are disposed in the first gate metal layer 211. In the first display region 101, the reset signal line and the light-emitting control signal line are disposed in the metal oxide layer 203. The reset signal line in the first display region 101 is electrically connected to the reset signal line in the second display region 102 by the first via 221, and the light-emitting control signal line in the first display region 101 is electrically connected to the light-emitting control signal line in the second display region 102 by the first via 221. In this case, the first via 221 is opened through the first passivation layer 222, the first source and drain metal layer 212, and the inter-layer dielectric layer 223.

Figure 7:
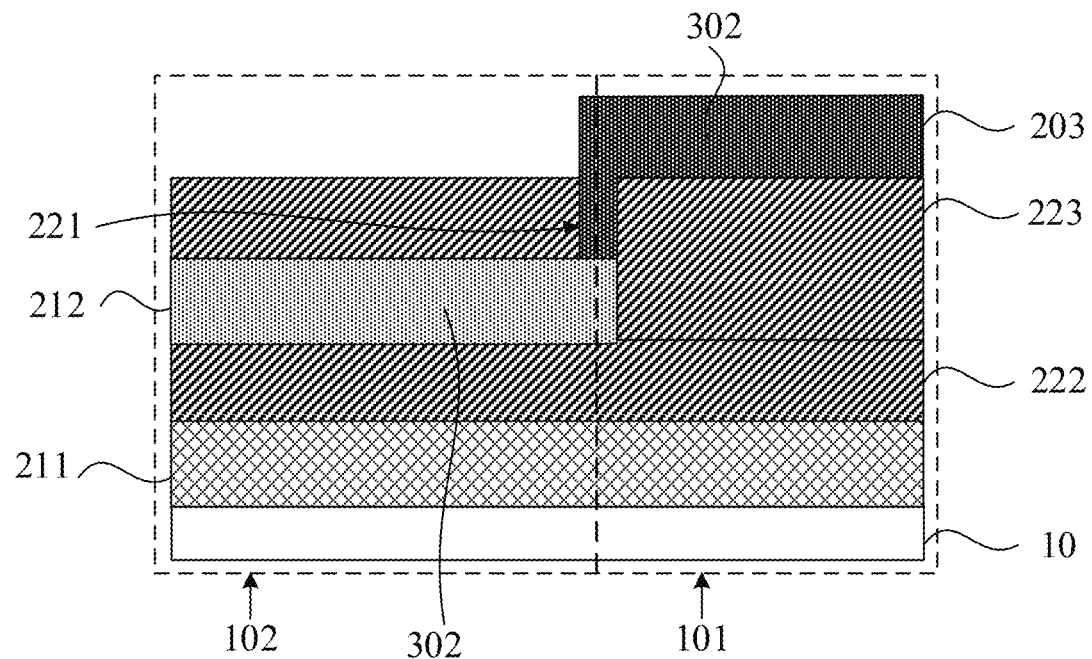
FIG. 7 is a schematic structural diagram of a display panel according to some embodiments of the present disclosure.

FIG. 7 is a schematic structural diagram of a display panel according to some embodiments of the present disclosure. Referring to FIG. 7, the display panel includes the first gate metal layer 211, the first passivation layer 222, the first source and drain metal layer 212, the inter-layer dielectric layer 223, and the metal oxide layer 203 that are disposed on the base substrate 10. In this case, the second signal lines 302 include the power signal line. In the first display region 101, the second signal line 302 is disposed in the metal oxide layer 203. In the second display region 102, the second signal line 302 is disposed in the first source and drain metal layer 212. FIG. 7 only shows the second signal line 302.

Referring to FIG. 7, the second signal lines 302 are the power signal lines. In the second display region 102, the power signal line is disposed in the first source and drain metal layer 212. In the first display region 101, the power signal line is disposed in the metal oxide layer 203. The power signal line in the first display region 101 is electrically connected to the power signal line in the second display region 102 by the first via 221. In this case, the first via 221 is opened through the inter-layer dielectric layer 223. In some embodiments, the power signal line is disposed in a second source and drain metal layer.

Figure 8:
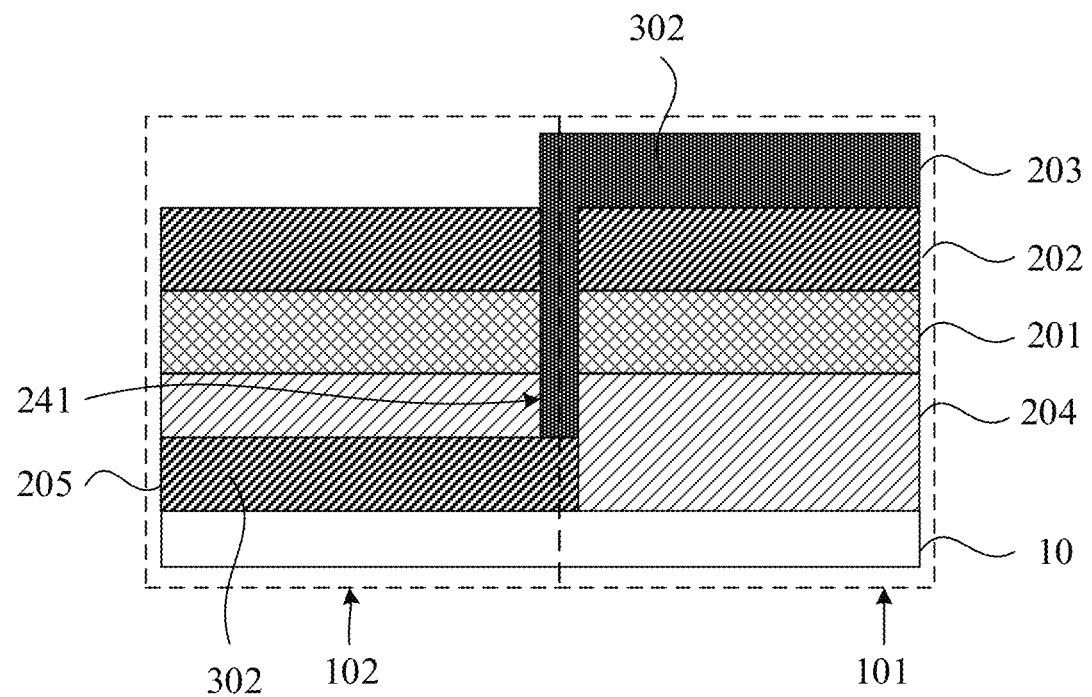
FIG. 8 is a schematic structural diagram of a display panel according to some embodiments of the present disclosure.

FIG. 8 is a schematic structural diagram of a display panel according to some embodiments of the present disclosure.

Referring to FIG. 8 and compared with FIG. 4, the display panel further includes a second insulative layer 204 and a second metal layer 205, and the second insulative layer 204 is disposed between the first metal layer 201 and the second metal layer 205. The first portions, in the first display region 101, of another part of the plurality of second signal lines 302 are disposed in the metal oxide layer 203, the second portions, in the second display region 102, of the another part of the plurality of second signal lines 302 are disposed in the second metal layer 205, and the first portions and the second portions of the another part of the plurality of second signal lines 302 are connected by a second via 241 opened through the first insulative layer 202 and the second insulative layer 204. The second via 241 is at the junction of the first display region 101 and the second display region 102.

In the embodiments of the present disclosure, the second metal layer 205 is a second gate metal layer, and the second insulative layer 204 is a first gate insulative layer.

Illustratively, the second signal lines 302 further include the reset signal line, the light-emitting control signal line, the initiation voltage signal line, and the power signal line. In the first display region 101, the reset signal line, the light-emitting control signal line, the initiation voltage signal line, and the power signal line are disposed in the metal oxide layer 203. In the second display region 102, the reset signal line, the light-emitting control signal line, the initiation voltage signal line, and the power signal line are disposed in the second gate metal layer.

In the embodiments of the present disclosure, the second metal layer 205 is a second gate metal layer, and the second insulative layer 204 is a first gate insulative layer.

Figure 9:
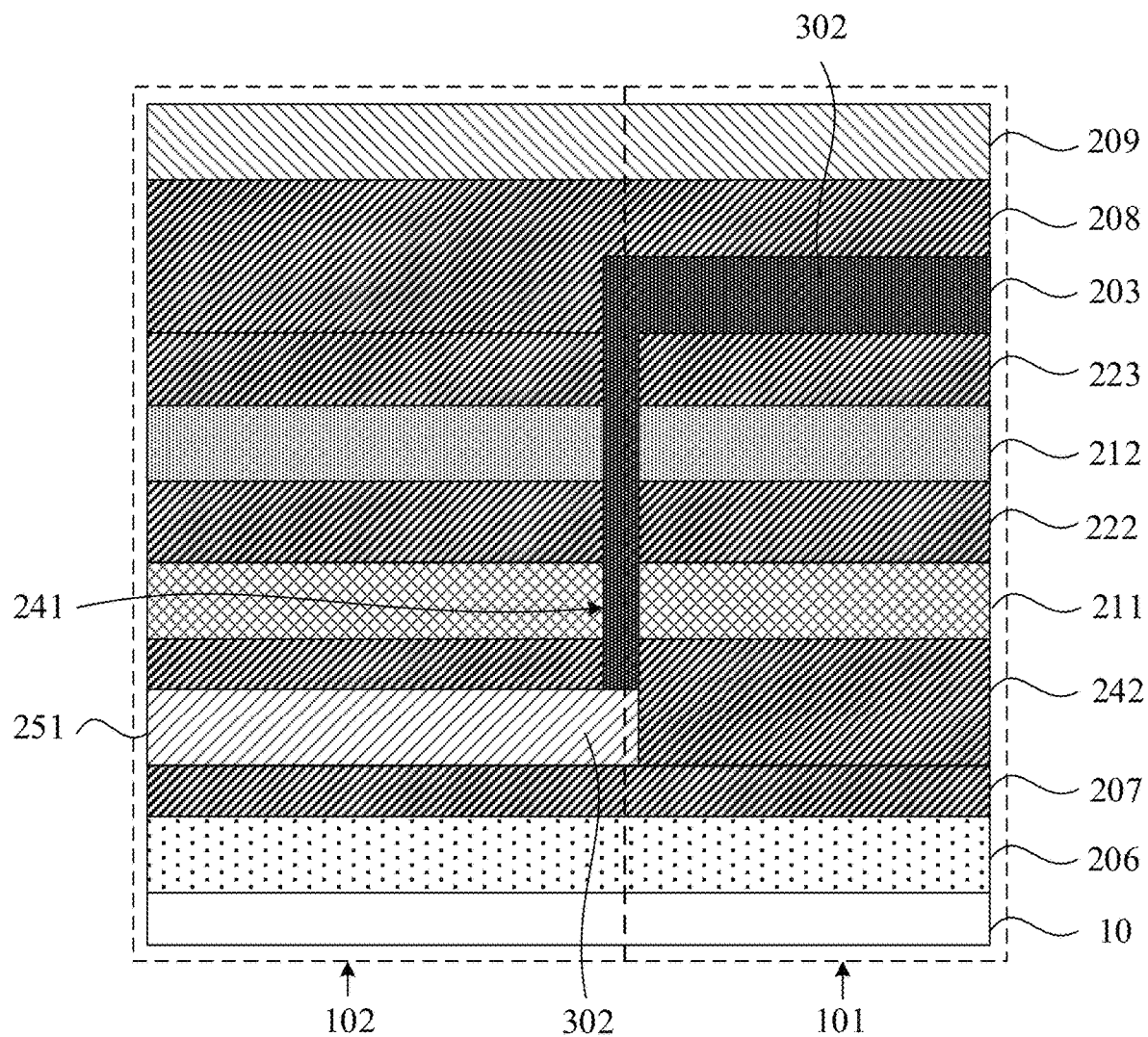
FIG. 9 is a schematic structural diagram of a display panel according to some embodiments of the present disclosure.

FIG. 9 is a schematic structural diagram of a display panel according to some embodiments of the present disclosure. Referring to FIG. 9 and compared with FIG. 8, the display panel includes the second gate metal layer 251, the first gate insulative layer 242, the first gate metal layer 211, the first passivation layer 222, the first source and drain metal layer 212, the inter-layer dielectric layer 223, and the metal oxide layer 203 that are sequentially disposed on the base substrate 10 in the direction away from the base substrate 10.

Referring to FIG. 9, the second signal lines 302 are the initiation voltage signal lines. In the second display region 102, the initiation voltage signal line is disposed in the second gate metal layer 251. In the first display region 101, the initiation voltage signal line is disposed in the metal oxide layer 203. Part of the initiation voltage signal line in the first display region 101 is electrically connected to part of the initiation voltage signal line in the second display region 102 by the second via 241. In this case, the second via 241 is opened through the first gate insulative layer 242, the first gate metal layer 211, the first passivation layer 222, the first source and drain metal layer 212, and the inter-layer dielectric layer 223.

It should be noted that the gate signal line is disposed in the first gate metal layer 211, and the data signal line is disposed in the first source and drain metal layer 212.

Referring to FIG. 9, the display panel further includes an active layer 206, a second gate insulative layer 207, a second passivation layer 208, and a second source and drain metal layer 209. The second gate insulative layer 207 is disposed between the active layer 206 and the second gate metal layer 251, and the second passivation layer 208 is disposed between the metal oxide layer 203 and the second source and drain metal layer 209.

The active layer 206 is a polycrystalline silicon material layer short for a poly layer. The second gate insulative layer 207 isolates the active layer 206 and the second gate metal layer 251. The second source and drain metal layer 209 is a line transfer layer, and the second passivation layer 208 isolates the first source and drain metal layer 212 and the second source and drain metal layer 209.

In the embodiments of the present disclosure, the first gate metal layer 211 and the second gate metal layer 251 include a molybdenum metal layer, and the first source and drain metal layer 212 and the second source and drain metal layer 209 include a titanium metal layer. The second gate insulative layer 207, the first gate insulative layer 242, the inter-layer dielectric layer 223, the first passivation layer 222, and the second passivation layer 208 are silicon nitride layers, silicon oxide layers, or epoxy resin layers.

In the embodiments of the present disclosure, the base substrate 10 is a glass base or a polyimide base.

Figure 10:
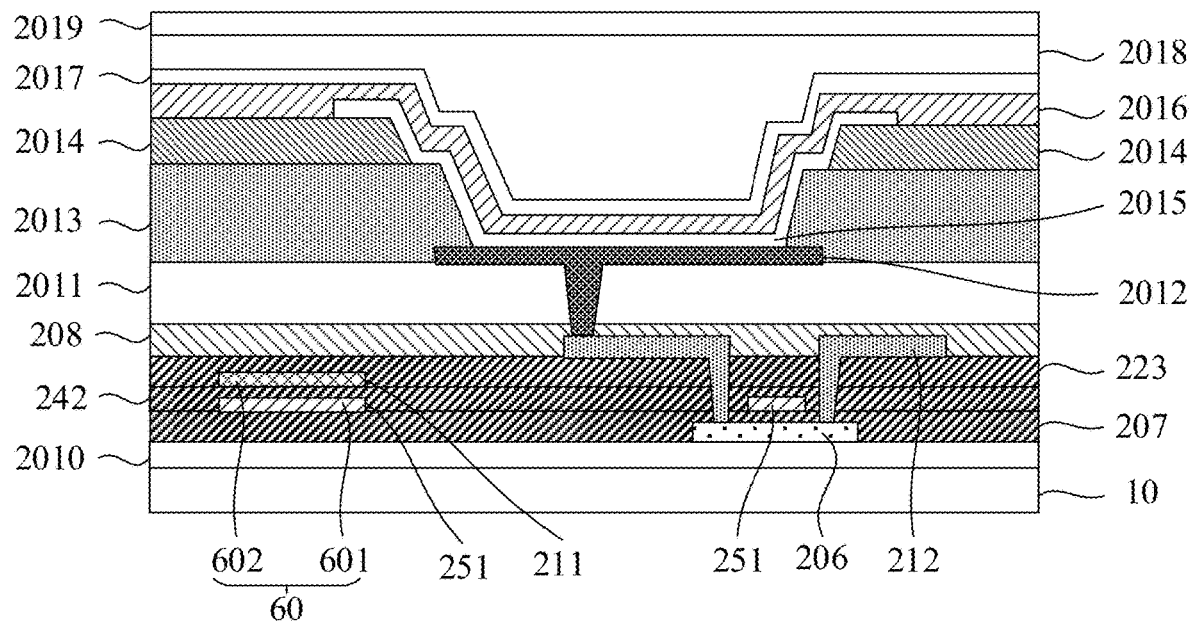
FIG. 10 is a schematic diagram of film layers of a pixel according to some embodiments of the present disclosure.

FIG. 4 to FIG. 9 shows partial film layers of the display panel, the complete film layer structure of the display panel is shown in conjunction with FIG. 10, and the film layer structure in FIG. 10 corresponds to the structure of the first pixel unit 20 in the above FIG. 2.

FIG. 10 is a schematic diagram of film layers of a pixel according to some embodiments of the present disclosure. Referring to FIG. 10, the display panel includes the buffer layer 2010, the active layer 206, the second gate insulative layer 207, the second gate metal layer 251, the first gate insulative layer 242, the first gate metal layer 211, the inter-layer dielectric layer 223, the first source and drain metal layer 212, the second passivation layer 208, a planarization layer 2011, an anode layer 2012, a pixel defining layer 2013, a spacer layer 2014, a light-emitting layer 2015, a cathode layer 2016, a first inorganic package layer 2017, an organic package layer 2018, and a second inorganic package layer 2019 that are disposed on the base substrate 10 in the direction away from the base substrate 10. In this case, the display panel only includes one source and drain metal layer, that is, the first source and drain metal layer 212.

The buffer layer 2010 is disposed between the base substrate 10 and the active layer 206, and is configured to reduce an effect on the base substrate 10 in etching the active layer 206.

The planarization layer 2011 is disposed on a side, distal from the first source and drain metal layer 212, of the second passivation layer 208, and is configured to flat a surface of the display panel including the first source and drain metal layer 212.

The anode layer 2012 is disposed on a side, distal from the first source and drain metal layer 212, of the planarization layer 2011, and is electrically connected to the first source and drain metal layer 212. The pixel defining layer 2013 is disposed on a side, distal from the first source and drain metal layer 212, of the anode layer 2012, and an opening is defined in the pixel defining layer 2013. The opening is connected to the anode layer 2012, and the light-emitting layer 2015 is disposed in the opening. The spacer layer 2014 is configured to support a mask plate in evaporating the light-emitting layer 2015. The cathode layer 2016 is disposed on a side, distal from the first source and drain metal layer 212, of the light-emitting layer 2015, and a voltage is formed between the another layer 2016 and the anode layer 2012 to control the light-emitting layer 2015 to emit light. The first inorganic package layer 2017, the organic package layer 2018, and the second inorganic package layer 2019 form a package layer to package the display panel, such that completeness of the display panel is ensured.

In the embodiments of the present disclosure, the pixel unit includes a capacitor 60. Referring to FIG. 10, a first electrode plate 601 of the capacitor 60 is disposed in the second gate metal layer 251, and a second electrode plate 602 of the capacitor 60 is disposed in the first gate metal layer 211.

In FIG. 10, the second gate insulative layer 207, the second gate metal layer 251, the first gate insulative layer 242, and the first gate metal layer 211 are sequentially disposed in the direction away from the base substrate 10. In some embodiments, the second gate insulative layer 207, the first gate metal layer 211, the first gate insulative layer 242, and the second gate metal layer 251 are sequentially disposed, which is not limited in the present disclosure.

Figure 11:
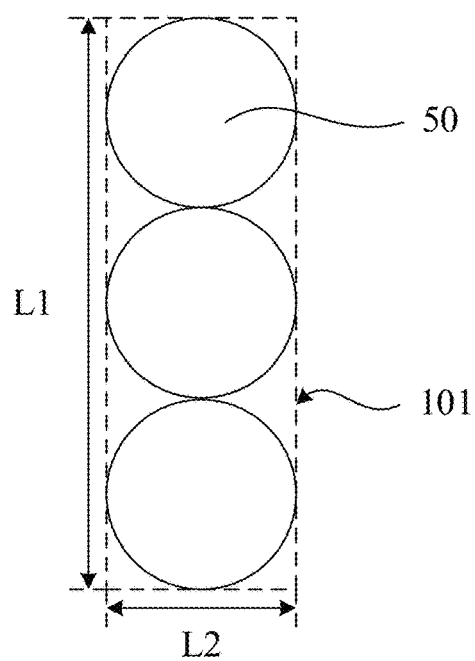
FIG. 11 is a top view of a first display region according to some embodiments of the present disclosure.

FIG. 11 is a top view of a first display region according to some embodiments of the present disclosure. Referring to FIG. 11, the first display region 101 is strip-shaped, a first size L1 of the first display region 101 is greater than a second size L2 of the first display region 101, the first size L1 of the first display region 101 is a size of the first display region 101 in an extension direction of the gate signal lines, and the second size L2 of the first display region 101 is a size of the first display region 101 in an extension direction of the data signal lines. The display device includes a plurality of photosensors 50. Orthogonal projections of the plurality of photosensors 50 on the display panel are within the first display region 101, and an extension direction of the plurality of photosensors 50 is parallel to the extension direction of the gate signal lines.

In FIG. 11, three photosensors 50 are disposed in a region in the display device corresponding to the first display region 101.

Figure 12:
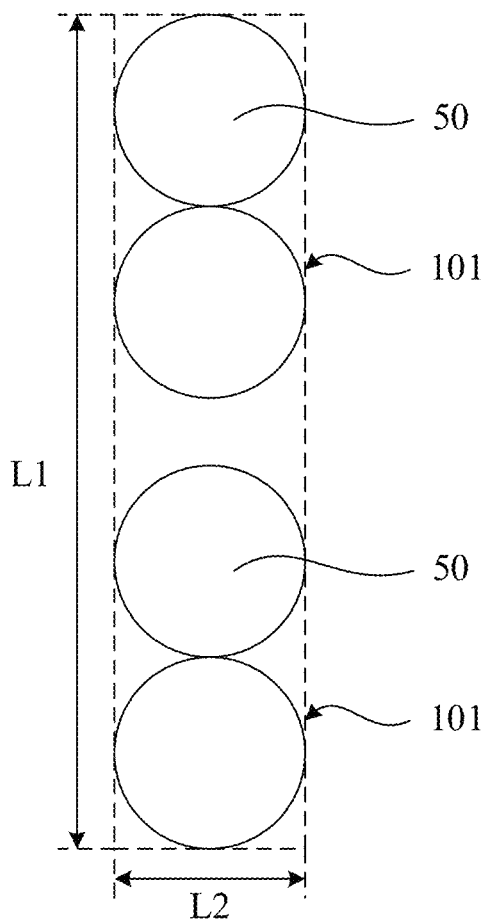
FIG. 12 is a top view of another first display region according to some embodiments of the present disclosure.

FIG. 12 is a top view of another first display region according to some embodiments of the present disclosure. Referring to FIG. 12, the display device includes four photosensors 50. The four photosensors 50 are organized into two sets, and one set includes two photosensors 50. A distance between two photosensors 50 in the same set is 0, and a gap is present between two adjacent sets of the photosensors 50.

In some embodiments, fewer or more than four photosensors 50 are arranged in the display device, and the number of the photosensors 50 is not limited in the embodiments of the present disclosure.

For the first display region 101 shown in FIG. 11 and FIG. 12, a ratio of the first size L1 of the first display region 101 to the second size L2 of the first display region 101 is greater than 2.

Figure 13:
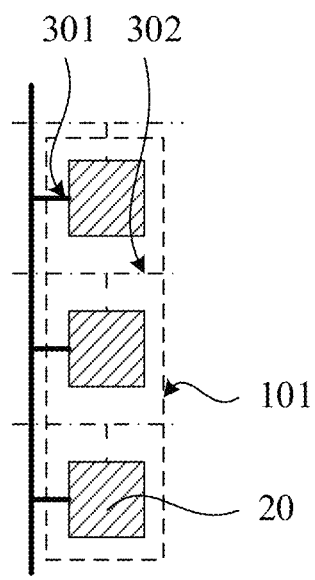
FIG. 13 is a schematic diagram of an arrangement of pixels in a first display region according to some embodiments of the present disclosure.

FIG. 13 is a schematic diagram of an arrangement of pixels in a first display region according to some embodiments of the present disclosure. In conjunction with FIG. 11 to FIG. 13, in the case that the ratio of the first size L1 of the first display region 101 to the second size L2 of the first display region 101 is greater than 2, the first signal line 301 is the gate signal line.

The gate signal line is electrically connected to the plurality of first pixel units 20, and has a loading. Thus, a gate voltage received by the first pixel unit 20 closer to the driving circuit is greater, and a gate voltage received by the first pixel unit 20 farther from the driving circuit is less. In the case that the ratio of the first size L1 of the first display region 101 to the second size L2 of the first display region 101 is greater than 2, a length of the gate signal line in the first display region 101 is greater than a length of the data signal line in the first display region 101. As the length of the signal line is negatively correlated with the resistance of the signal line, the display nonuniformity caused by the gate signal line is much in the first display region 101. By disposing the gate signal line as the metal signal line, the display nonuniformity caused by the gate signal line is reduced, and the display nonuniformity is solved.

In FIG. 11 to FIG. 13, the first display region 101 extends in an extension direction of the first size L1. In some embodiments, the first display region 101 extends in other directions.

Figure 14:
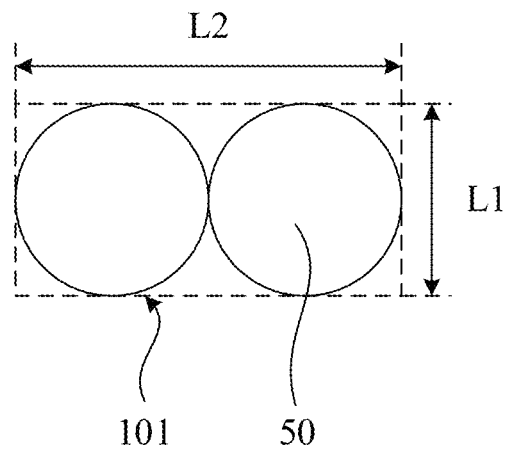
FIG. 14 is a top view of another first display region according to some embodiments of the present disclosure.

FIG. 14 is a top view of another first display region according to some embodiments of the present disclosure. Referring to FIG. 14, the first display region 101 is strip-shaped, the first size L1 of the first display region 101 is less than the second size L2 of the first display region 101, a plurality of photosensors 50 are disposed in the first display region 101, and the extension direction of the plurality of photosensors 50 is an extension direction of the second size L2.

Figure 15:
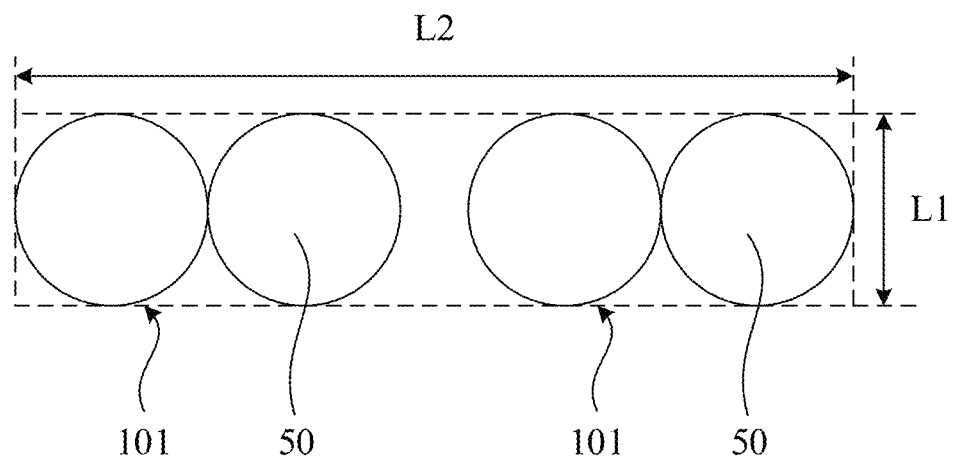
FIG. 15 is a top view of another first display region according to some embodiments of the present disclosure.

In FIG. 14, the display device includes two photosensors 50. FIG. 15 is a top view of another first display region according to some embodiments of the present disclosure. Referring to FIG. 15, the display device includes four photosensors 50. The four photosensors 50 are organized into two sets, and one set includes two photosensors 50. A distance between two photosensors 50 in the same set is 0, and a gap is present between adjacent two sets of the photosensors 50.

Figure 16:
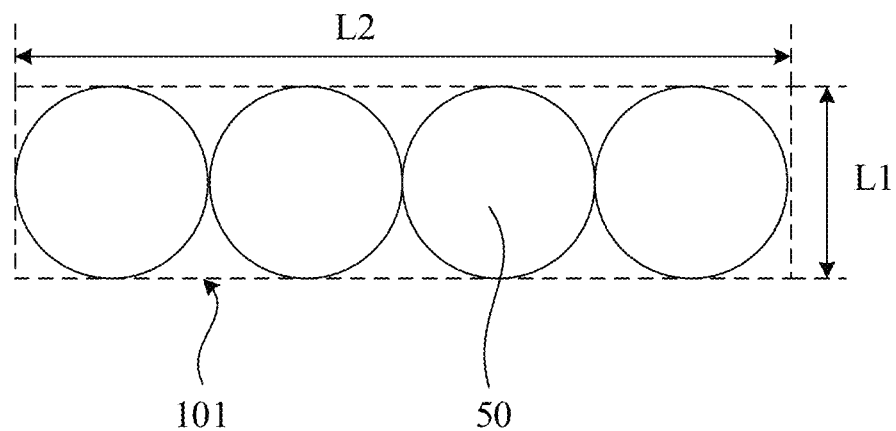
FIG. 16 is a top view of another first display region according to some embodiments of the present disclosure.

FIG. 16 is a top view of another first display region according to some embodiments of the present disclosure. Referring to FIG. 16, the display device includes four photosensors 50, and a distance between two adjacent photosensors 50 is 0.

Figure 17:
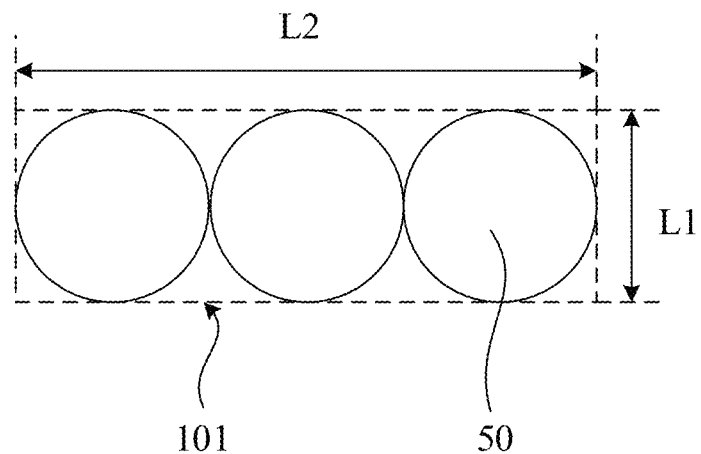
FIG. 17 is a top view of another first display region according to some embodiments of the present disclosure.

FIG. 17 is a top view of another first display region according to some embodiments of the present disclosure. Referring to FIG. 17, the display device includes three photosensors 50, and a distance between two adjacent photosensors 50 is 0.

In some embodiments, other numbers of photosensors 50 are arranged in the display device, and the number of the photosensors 50 is not limited in the embodiments of the present disclosure.

Figure 18:
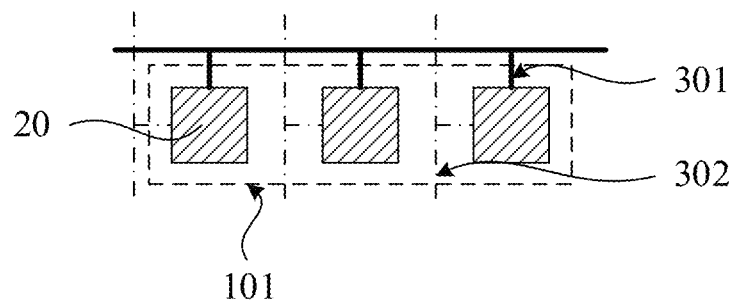
FIG. 18 is a schematic diagram of another arrangement of pixels in a first display region according to some embodiments of the present disclosure.

For the first display region 101 shown in FIG. 14 and FIG. 17, a ratio of the first size L1 of the first display region 101 to the second size L2 of the first display region 101 is less than 0.5. FIG. 18 is a schematic diagram of another arrangement of pixels in a first display region according to some embodiments of the present disclosure. In conjunction with FIG. 14 to FIG. 18, in the case that the ratio of the first size L1 of the first display region 101 to the second size L2 of the first display region 101 is less than 0.5, the first signal line 301 is the data signal line.

The data signal line is similar to the gate signal line, a data voltage received by the first pixel unit 20 closer to the driving circuit is greater, and a data voltage received by the first pixel unit 20 farther from the driving circuit is less. In the case that the ratio of the first size L1 of the first display region 101 to the second size L2 of the first display region 101 is less than 0.5, a length of the data signal line in the first display region 101 is greater than a length of the gate signal line in the first display region 101. In the first display region 101, the display nonuniformity caused by the data signal line is much. By disposing the data signal line as the metal signal line, the display nonuniformity caused by the data signal line is reduced, and the display nonuniformity is solved.

In FIG. 11 to FIG. 18, the first display region 101 is strip-shaped. In some embodiments, the first display region 101 is block-shaped.

Figure 19:
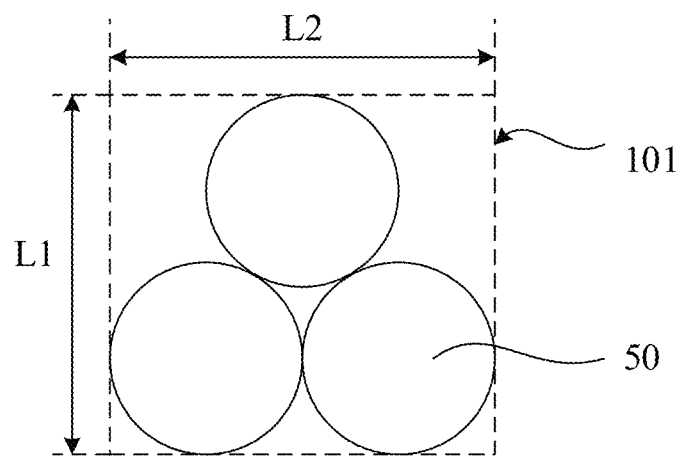
FIG. 19 is a top view of another first display region according to some embodiments of the present disclosure.

FIG. 19 is a top view of another first display region according to some embodiments of the present disclosure. Referring to FIG. 19, the first display region 101 is block-shaped. A difference between the first size L1 of the first display region 101 and the second size L2 of the first display region 101 is less, three photosensors 50 are disposed in the first display region 101, and the three photosensors 50 are disposed in a triangle shape.

Figure 20:
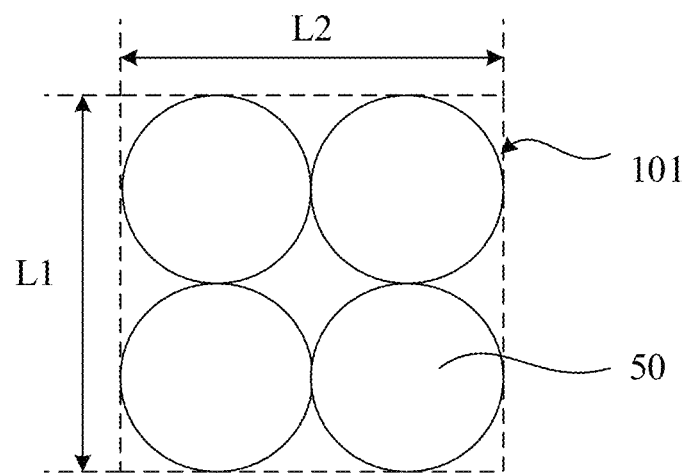
FIG. 20 is a top view of another first display region according to some embodiments of the present disclosure.

In FIG. 19, the display device includes three photosensors 50. FIG. 20 is a top view of another first display region according to some embodiments of the present disclosure. Referring to FIG. 20, the display device includes four photosensors 50, and the four photosensors 50 are disposed in a square shape.

Figure 21:
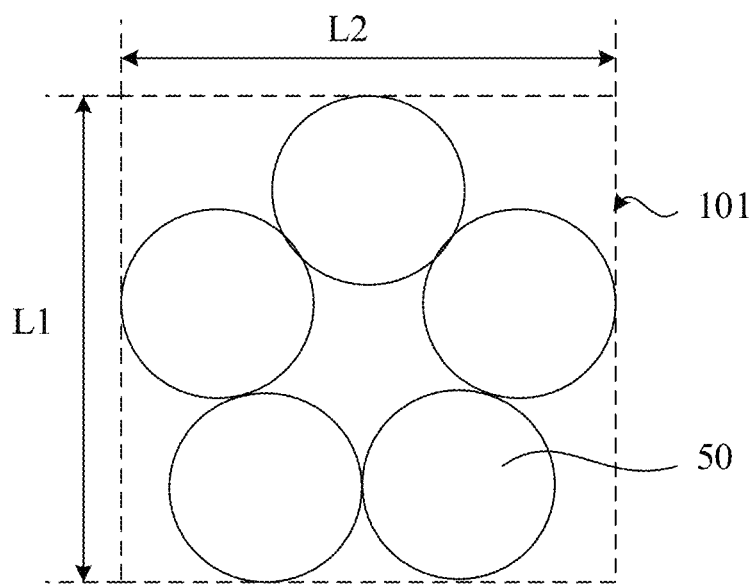
FIG. 21 is a top view of another first display region according to some embodiments of the present disclosure.

FIG. 21 is a top view of another first display region according to some embodiments of the present disclosure. Referring to FIG. 21, the display device includes five photosensors 50, and the five photosensors 50 are disposed in a pentagon shape.

Figure 22:
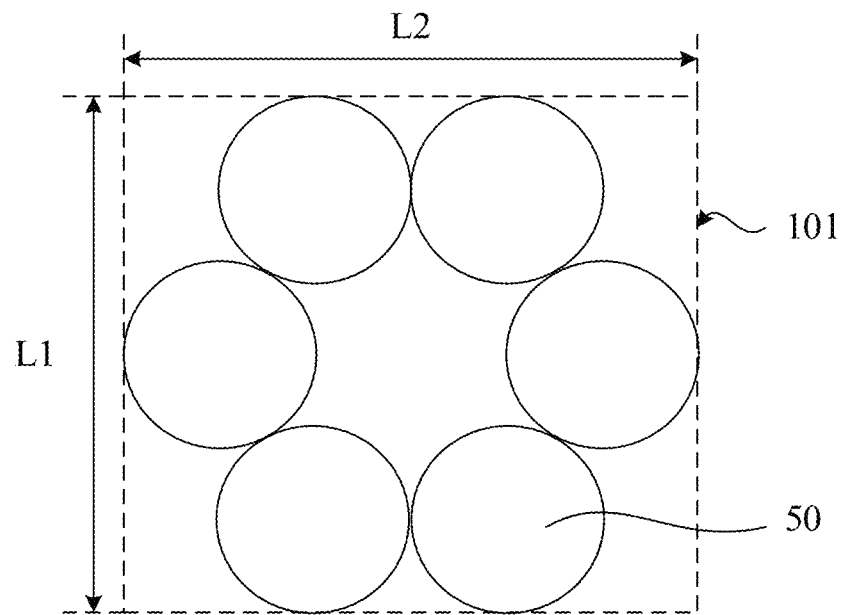
FIG. 22 is a top view of another first display region according to some embodiments of the present disclosure.

FIG. 22 is a top view of another first display region according to some embodiments of the present disclosure. Referring to FIG. 22, the display device includes six photosensors 50, and the six photosensors 50 are disposed in a hexagon shape.

In some embodiments, other numbers of photosensors 50 are arranged in the display device includes, and the number of the photosensors 50 is not limited in the embodiments of the present disclosure.

Figure 23:
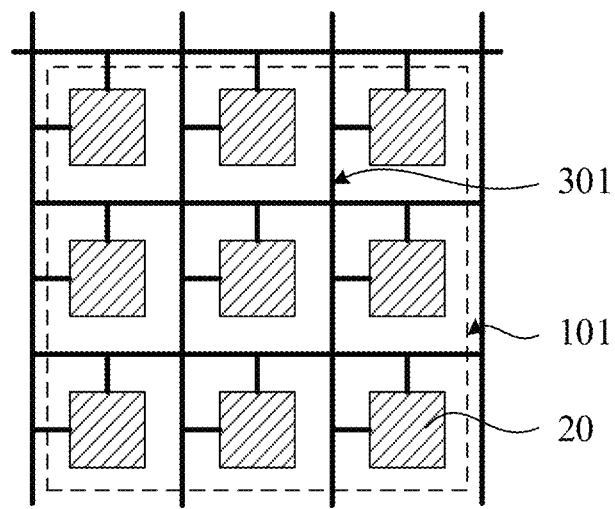
FIG. 23 is a schematic diagram of another arrangement of pixels in a first display region according to some embodiments of the present disclosure.

For the first display region 101 shown in FIG. 19 and FIG. 22, a ratio of the first size L1 of the first display region 101 to the second size L2 of the first display region 101 ranges from 0.5 to 2. FIG. 23 is a schematic diagram of another arrangement of pixels in a first display region according to some embodiments of the present disclosure. In conjunction with FIG. 19 to FIG. 23, in the case that the ratio of the first size L1 of the first display region 101 to the second size L2 of the first display region 101 ranges from 0.5 to 2, the first signal lines 301 include the gate signal line and the data signal line.

In the case that the ratio of the first size L1 of the first display region 101 to the second size L2 of the first display region 101 ranges from 0.5 to 2, in the first display region 101, a difference between the length of the gate signal line and the length of the data signal line is less, and a difference in the display nonuniformity caused by the gate signal line and the data signal line is not great. By disposing the gate signal line and the data signal line as the metal signal line, the display nonuniformity caused by the gate signal line and the data signal line is reduced, and the display nonuniformity is solved.

Figure 24:
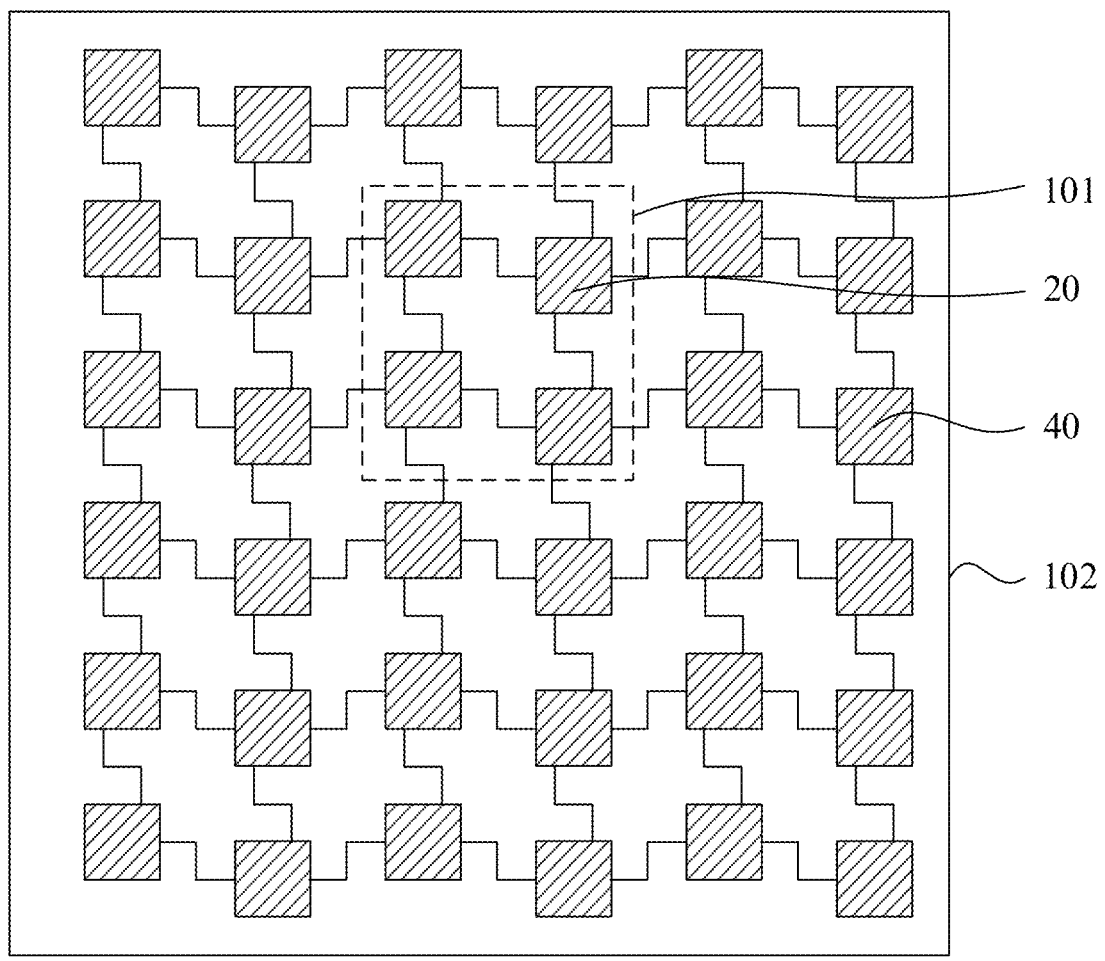
FIG. 24 is a schematic structural diagram of a display panel according to some embodiments of the present disclosure.

FIG. 24 is a schematic structural diagram of a display panel according to some embodiments of the present disclosure. Referring to FIG. 24, the display panel includes a plurality of first pixel units 20 and a plurality of second pixel units 40. The plurality of first pixel units 20 and the plurality of second pixel units 40 are arranged in a plurality of rows, pixel units in two adjacent rows are staggered in an arrangement direction of one row of pixel units, and the pixel units in two adjacent rows are connected by one gate signal line.

By staggering the plurality of rows of pixel units, more pixel units are disposed in the same area, such that a density of the pixel units is improved, a resolution of the display panel is improved, and the display effect is further improved. Meanwhile, the pixel units in two adjacent rows are connected by one gate signal line to avoid complex tracing and simplify the circuit structure.

Referring to FIG. 3 and FIG. 24, the gate signal line is wavy, and peaks of wave and valleys of wave of the gate signal line are respectively connected to the first pixel units 20 or the second pixel units 40.

Referring to FIG. 3 and FIG. 24, the data signal line is also wavy.

In the embodiments of the present disclosure, both the first pixel unit 20 and the second pixel unit 40 include a 7T1C pixel circuit.

Figure 25:
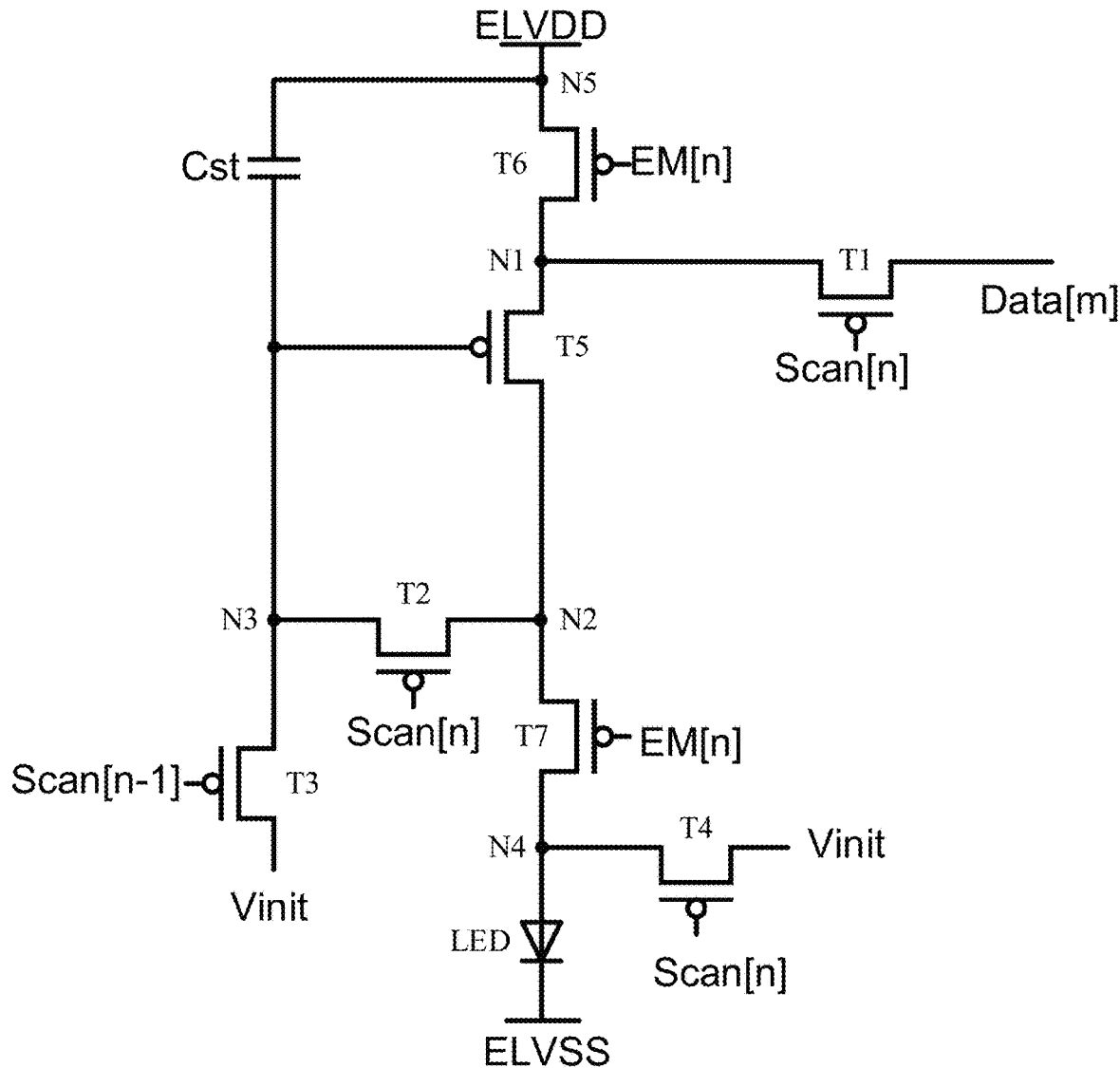
FIG. 25 is a schematic diagram of a 7T1C pixel circuit according to some embodiments of the present disclosure.

FIG. 25 is a schematic diagram of a 7T1C pixel circuit according to some embodiments of the present disclosure. Referring to FIG. 25, the pixel circuit includes a first switch transistor T1, a first compensation transistor T2, a first reset transistor T3, a second reset transistor T4, a driving transistor T5, a first light-emitting control transistor T6, a second light-emitting control transistor T7, and a capacitor Cst.

A control electrode of the first switch transistor T1 is electrically connected to one gate line through a first scan signal terminal (Scan[n]), a first electrode of the first switch transistor T1 is electrically connected to one data line through a data input terminal (Date[m]), and a second electrode of the first switch transistor T1 is electrically connected to a first node N1.

A control electrode of the first compensation transistor T2 is electrically connected to one gate line through the first scan signal terminal (Scan[n]), a first electrode of the first compensation transistor T2 is electrically connected to a second node N2, and a second electrode of the first compensation transistor T2 is electrically connected to a third node N3.

A control electrode of the first reset transistor T3 is electrically connected to another gate line through a second scan signal terminal (Scan[n−1]), a first electrode of the first reset transistor T3 is electrically connected to an initiation voltage signal line through an initiation voltage terminal (Vinit), and a second electrode of the first reset transistor T3 is electrically connected to the third node N3.

A control electrode of the second reset transistor T4 is electrically connected to one gate line through the first scan signal terminal (Scan[n]), a first electrode of the second reset transistor T4 is electrically connected to the initiation voltage signal line through the initiation voltage terminal (Vinit), and a second electrode of the second reset transistor T4 is electrically connected to a fourth node N4.

A control electrode of the driving transistor T5 is electrically connected to the third node N3, a first electrode of the driving transistor T5 is electrically connected to the first node N1, and a second electrode of the driving transistor T5 is electrically connected to the second node N2.

A control electrode of the first light-emitting control transistor T6 is electrically connected to one light-emitting control signal line through the light-emitting control signal terminal (Em[n]), a first electrode of the first light-emitting control transistor T6 is electrically connected to the first node N1, and a second electrode of the first light-emitting control transistor T6 is electrically connected to a fifth node N5. The fifth node N5 is electrically connected to the power signal line through a first voltage signal terminal (ELVDD).

A control electrode of the second light-emitting control transistor T7 is electrically connected to one light-emitting control signal line through the light-emitting control signal terminal (Em[n]), a first electrode of the second light-emitting control transistor T7 is electrically connected to the second node N2, and a second electrode of the second light-emitting control transistor T7 is electrically connected to a fourth node N4.

A first electrode plate of the capacitor Cst is electrically connected to the fifth node N5, and a second electrode plate of the capacitor Cst is electrically connected to the third node N3.

Referring to FIG. 25, the pixel circuit further includes a light-emitting diode (LED), the fourth node N4 is electrically connected to one terminal of the LED, and the other end of the LED is electrically connected to a second voltage signal terminal (ELVSS).

The 7T1C pixel circuit in the embodiments of the present disclosure is only exemplary. In some embodiments, the pixel circuit is of other structures, for example, a 2T1C pixel circuit.

Figure 26:
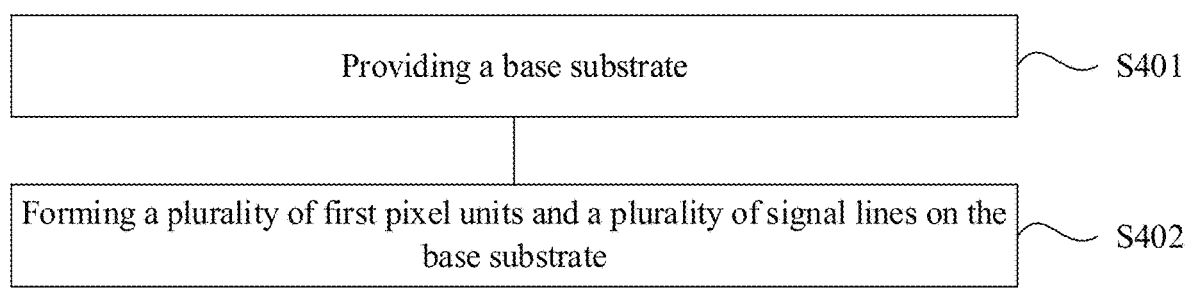
FIG. 26 is a flowchart of a method for manufacturing a display panel according to some embodiments of the present disclosure.

FIG. 26 is a flowchart of a method for manufacturing a display panel according to some embodiments of the present disclosure. The display panel includes a transparent first display region. Referring to FIG. 26, the method includes the following processes.

In S401, a base substrate is provided.

The base substrate includes a display region and a periphery region at least partially surrounding the display region. The display region includes a first display region and a second display region disposed at least on one side of the first display region, and a light transmittance of the first display region is greater than a light transmittance of the second display region.

In the embodiments of the present disclosure, the base substrate is a glass base or a polyimide base.

In S402, a plurality of first pixel units and a plurality of signal lines are formed on the base substrate.

The plurality of first pixel units are disposed in the first display region. The plurality of signal lines are disposed at least in the first display region and electrically connected to the plurality of first pixel units. The plurality of signal lines include a plurality of first signal lines and a plurality of second signal lines. A first portion of each of the plurality of first signal lines is a metal signal line and is disposed at least in the first display region, and a first portion of each of the plurality of second signal lines is a metal oxide signal line and is disposed at least in the first display region.

Illustratively, S402 includes the following processes.

Figure 27:
FIG. 27 is a flowchart of a method for manufacturing a display panel according to some embodiments of the present disclosure.

FIG. 27 is a flowchart of a method for manufacturing a display panel according to some embodiments of the present disclosure. Referring to FIG. 27, the method includes the following processes.

In S421, an active layer is formed on a side of the base substrate.

Figure 28:
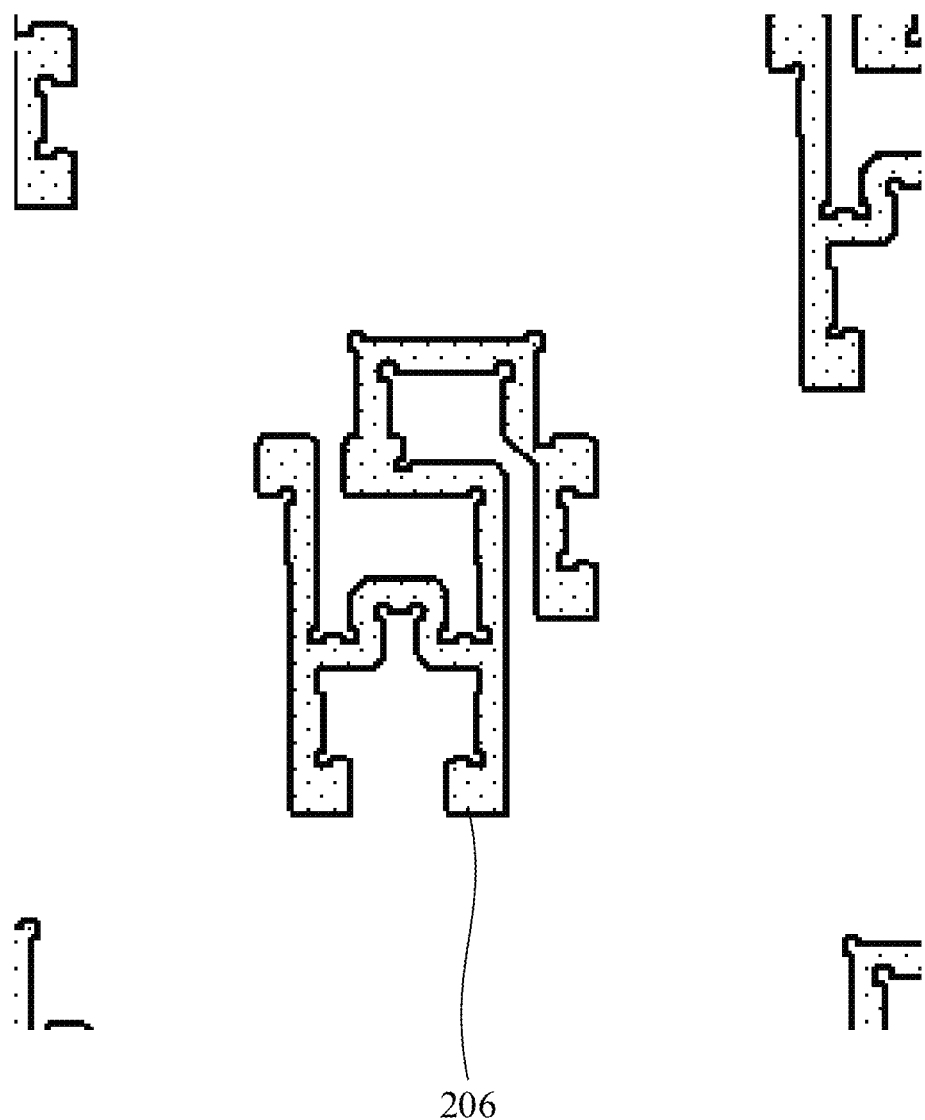
FIG. 28 is a flowchart of a method for manufacturing a display panel according to some embodiments of the present disclosure.

Illustratively, the active layer is a polycrystalline silicon layer. FIG. 28 is a flowchart of a method for manufacturing a display panel according to some embodiments of the present disclosure. Referring to FIG. 28, an active thin film is formed on a side of the base substrate by evaporating, and the active thin film is patterned by a patterning process to acquire the active layer 206 shown in FIG. 28. It should be noted that the active layer 206 includes active patterns corresponding to the plurality of pixel units. As shown in FIG. 28, a center portion includes a complete active pattern, and four corners respectively include other four active patterns. FIG. 29 to FIG. 35 are similar to FIG. 28, in which the center portion includes a pixel unit, and four corners respectively include other pixel units. The display panel shown in FIG. 28 to FIG. 35 are disposed in the first display region.

In S422, a second gate insulative layer is formed on a side, distal from the base substrate, of the active layer.

Illustratively, the second gate insulative layer is a silicon nitride layer, and is formed on a side of the active layer by evaporating. The second gate insulative layer covers the active layer.

In S423, a first gate metal layer is formed on a side, distal from the base substrate, of the second gate insulative layer.

Figure 29:
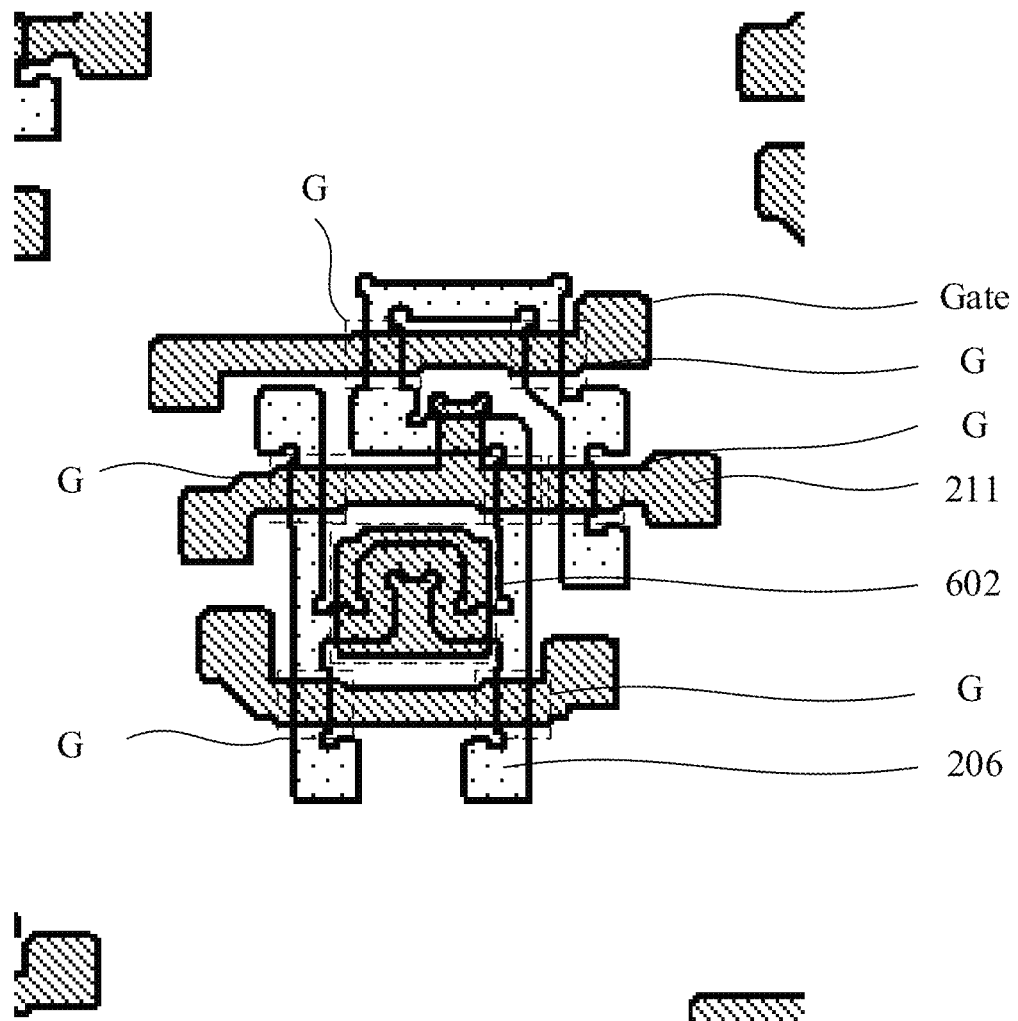
FIG. 29 is a flowchart of a method for manufacturing a display panel according to some embodiments of the present disclosure.

FIG. 29 is a flowchart of a method for manufacturing a display panel according to some embodiments of the present disclosure. Referring to FIG. 29, the first gate metal layer 211 is formed on the second gate insulative layer. In the first display region, the first gate metal layer includes a second electrode plate 602 of the capacitor, a control electrode G of the thin-film transistor, and the gate signal line Gate.

In some embodiments of the present disclosure, the gate signal lines Gate in the first display region and the second display region are disposed in the first gate metal layer. In the second display region, a first portion of the reset signal line and a first portion of the light-emitting control signal line are disposed in the first gate metal layer.

Illustratively, the first gate metal layer is a molybdenum metal layer. A first gate metal thin film is formed on a side of the first gate insulative layer by sputtering, and the first gate metal thin film is patterned by a patterning process to acquire the first gate metal layer.

In S424, a first gate insulative layer is formed on a side, distal from the base substrate, of the first gate metal layer.

Illustratively, the first gate insulative layer is a silicon nitride layer, and is formed on a side of the second gate metal layer by evaporating. The first gate insulative layer covers the second gate metal layer.

In S425, a second gate metal layer is formed on a side, distal from the base substrate, of the first gate insulative layer.

Figure 30:
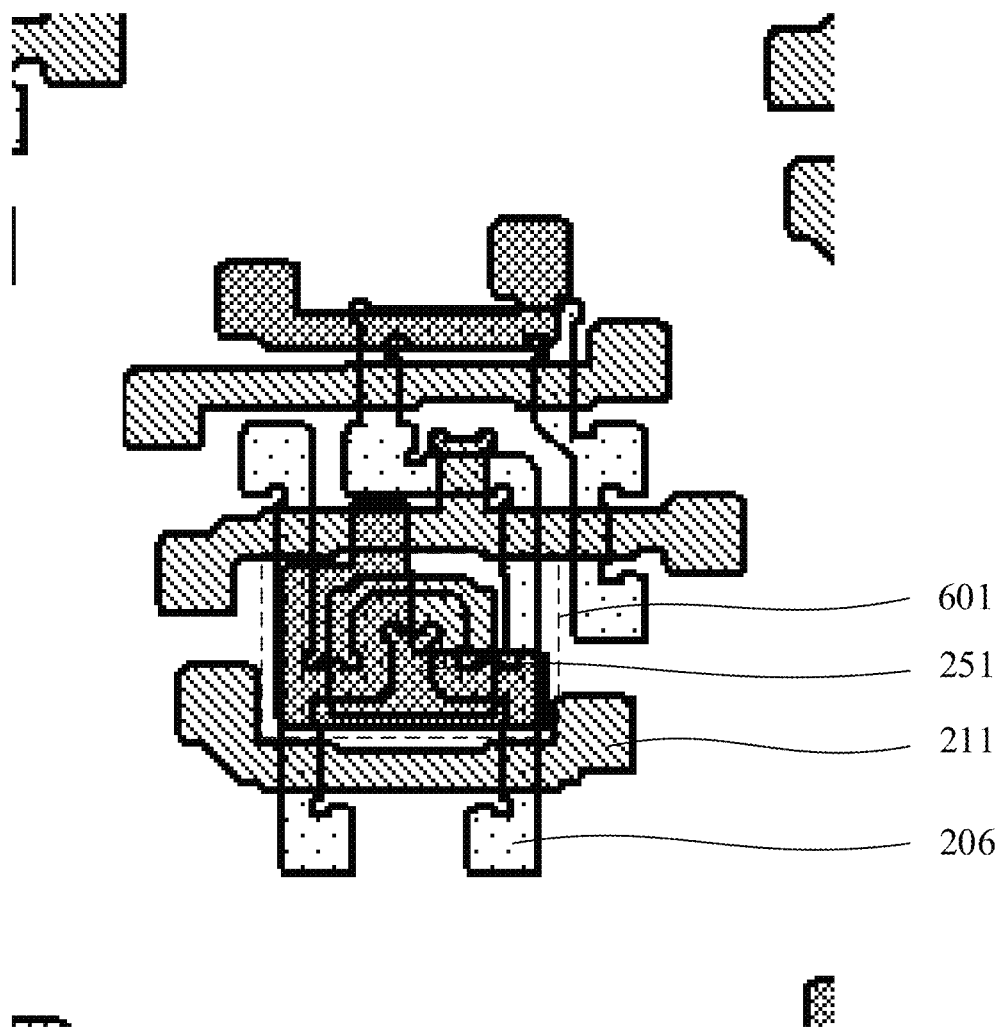
FIG. 30 is a flowchart of a method for manufacturing a display panel according to some embodiments of the present disclosure.

Illustratively, the second gate metal layer is a molybdenum metal layer. FIG. 30 is a flowchart of a method for manufacturing a display panel according to some embodiments of the present disclosure. Referring to FIG. 30, a second gate metal thin film is formed on a side of the first gate insulative layer by sputtering, and the second gate metal thin film is patterned by a patterning process to acquire the second gate metal layer 251. In the first display region, the second gate metal layer 251 includes the first electrode plate 601 of the capacitor.

In S426, a first passivation layer is formed on a side, distal from the base substrate, of the second gate metal layer.

Illustratively, the first passivation layer is a silicon nitride layer, and is formed on a side of the second gate metal layer by evaporating.

Figure 31:
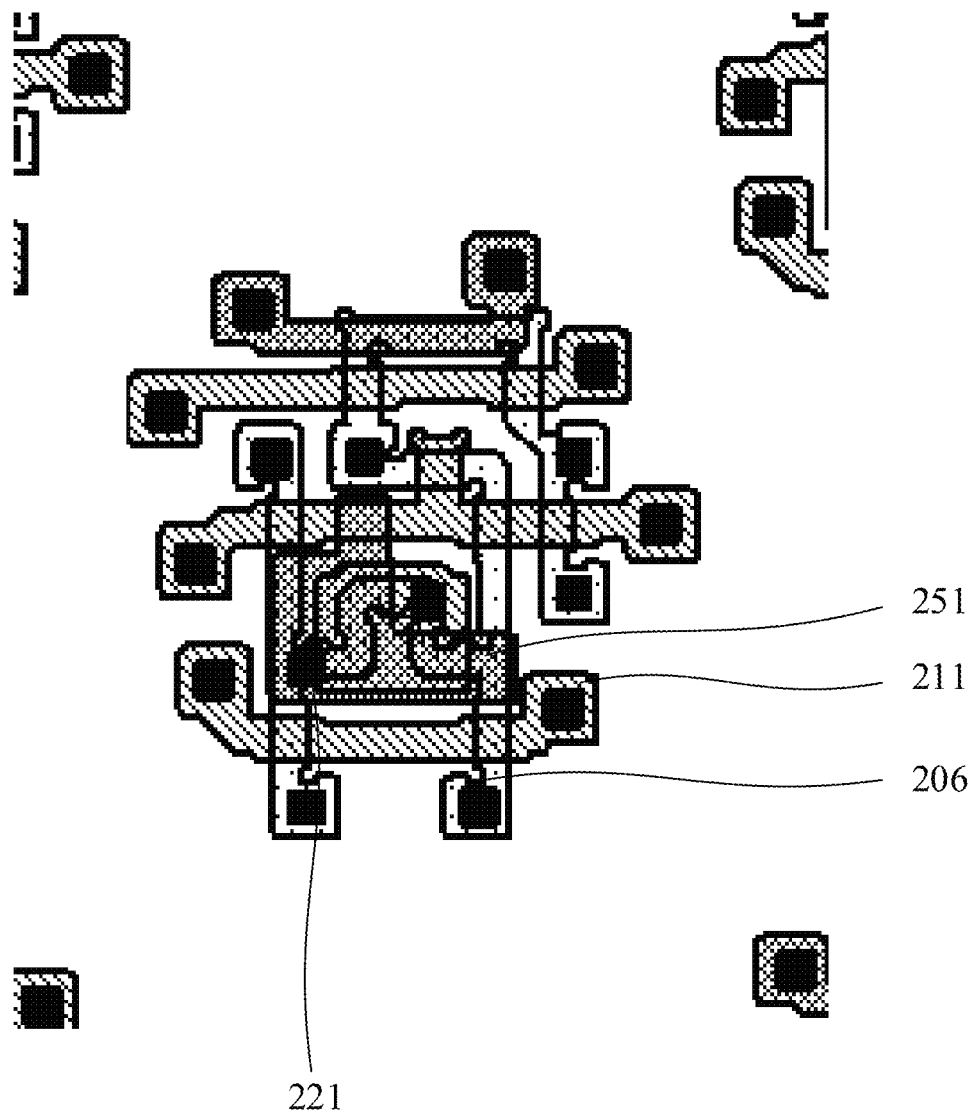
FIG. 31 is a flowchart of a method for manufacturing a display panel according to some embodiments of the present disclosure.

FIG. 31 is a flowchart of a method for manufacturing a display panel according to some embodiments of the present disclosure. Referring to FIG. 31, a first via 221 is formed in the first passivation layer.

Illustratively, the first via 221 is formed by etching.

In S427, a first source and drain metal layer is formed on a side, distal from the base substrate, of the first passivation layer.

Figure 32:
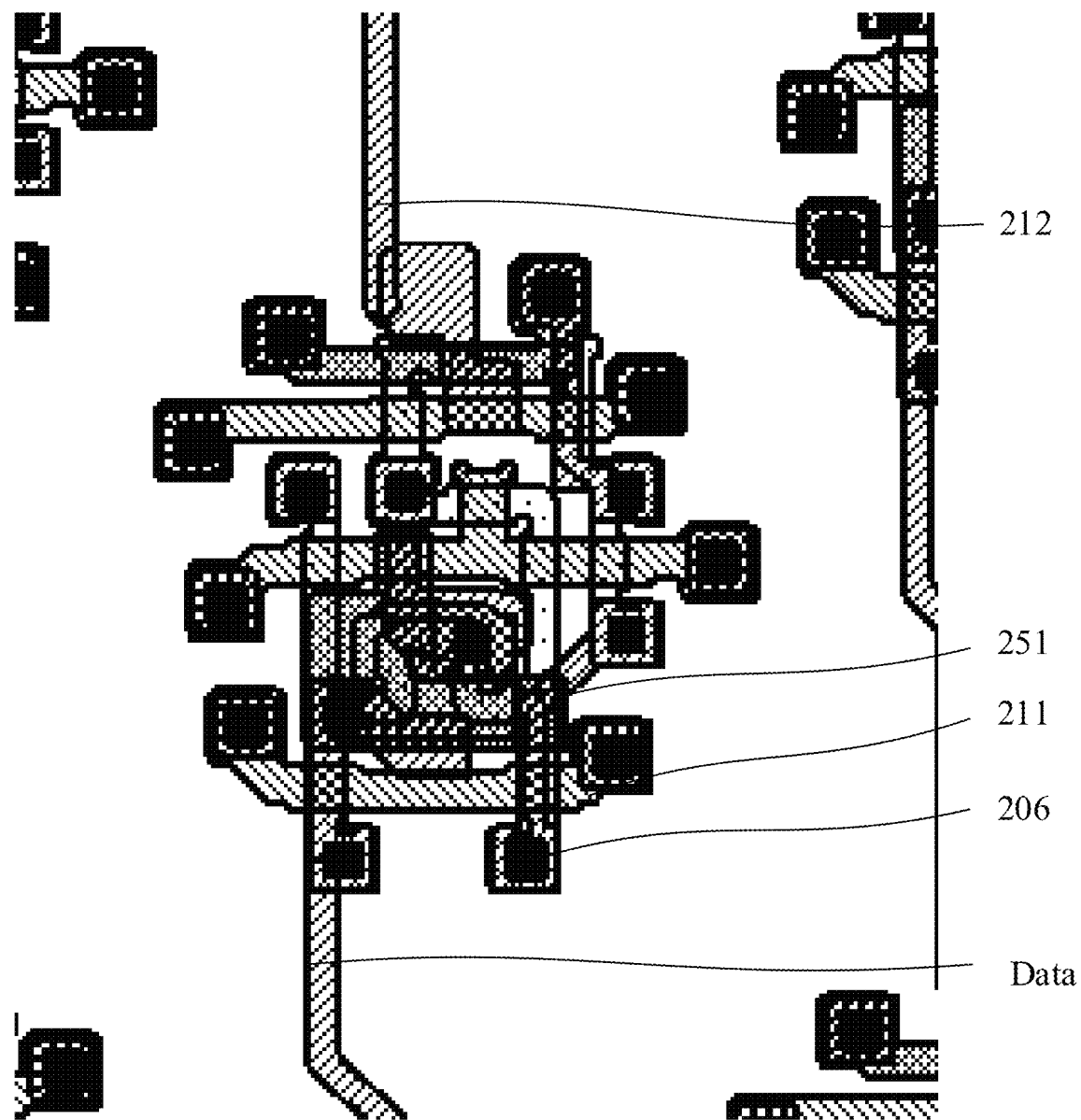
FIG. 32 is a flowchart of a method for manufacturing a display panel according to some embodiments of the present disclosure.

FIG. 32 is a flowchart of a method for manufacturing a display panel according to some embodiments of the present disclosure. Referring to FIG. 32, a first source and drain metal thin film is formed on a side of the first passivation layer by sputtering, and the first source and drain metal thin film is patterned by a patterning process to acquire the first source and drain metal layer 212.

In the embodiments of the present disclosure, the data signal line Data is disposed in the first source and drain metal layer.

In S428, an inter-layer dielectric layer is formed on a side, distal from the base substrate, of the first source and drain metal layer.

Illustratively, the inter-layer dielectric layer is a silicon nitride layer, and is formed on a side of the metal oxide layer by evaporating.

In S429, a metal oxide layer is formed on a side, distal from the base substrate, of the inter-layer dielectric layer.

Figure 33:
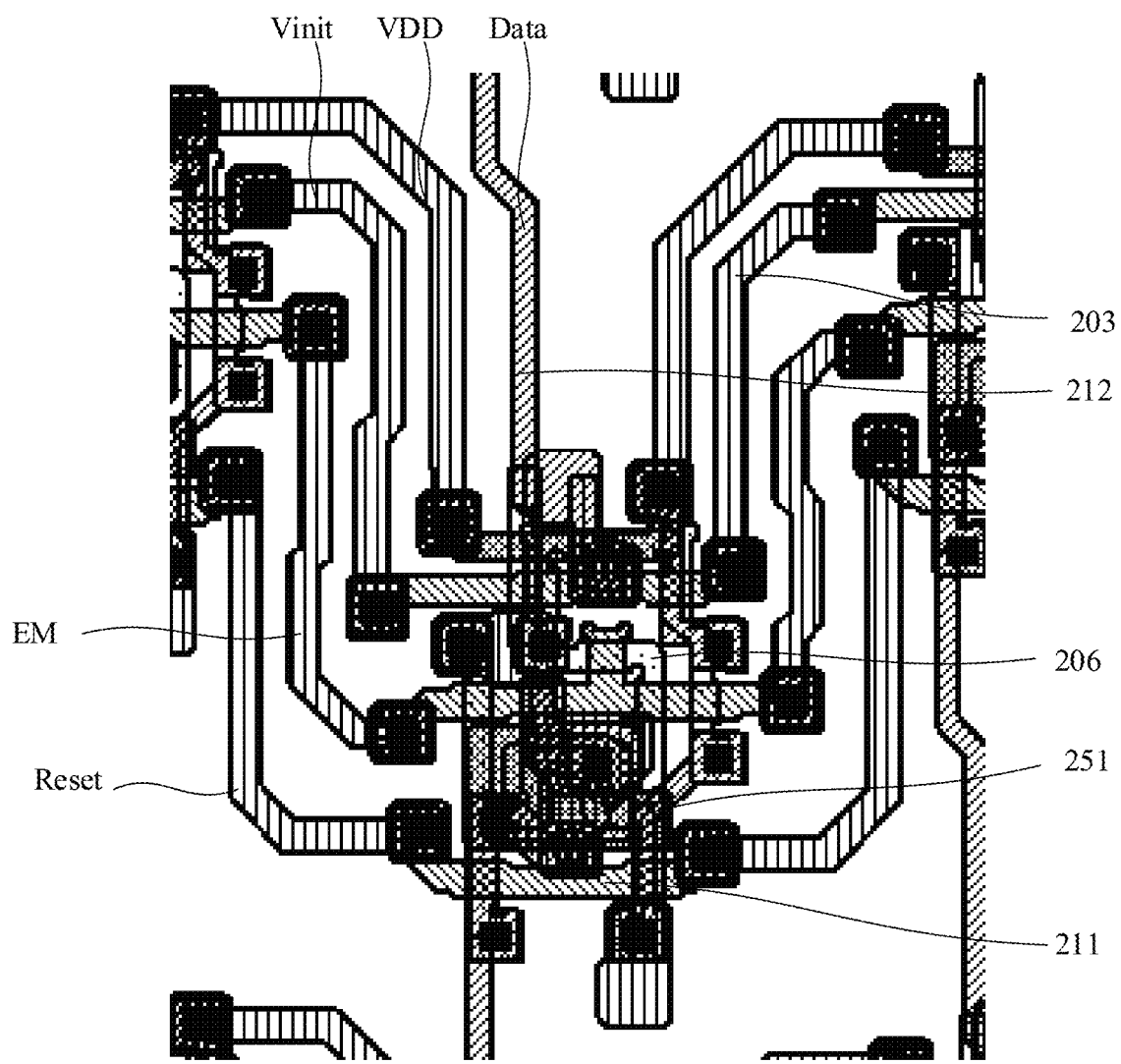
FIG. 33 is a flowchart of a method for manufacturing a display panel according to some embodiments of the present disclosure.

FIG. 33 is a flowchart of a method for manufacturing a display panel according to some embodiments of the present disclosure. Referring to FIG. 33, a metal oxide thin film is formed on a side of the inter-layer dielectric layer by sputtering, and the metal oxide thin film is patterned by a patterning process to acquire the metal oxide layer 203.

In the embodiments of the present disclosure, in the first display region, a second portion of the reset signal line (Reset), a second portion of the light-emitting control signal line (EM), and a second portion of the initiation voltage signal line (Vinit) are disposed in the metal oxide layer 203, and a first portion of the power signal lines (VDD) is disposed in the metal oxide layer.

The first portion of the reset signal line is electrically connected to the second portion of the reset signal line by the first via, the first portion of the light-emitting control signal line is electrically connected to the second portion of the light-emitting control signal line by the first via, and the first portion of the initiation voltage signal line is electrically connected to the second portion of the initiation voltage signal line by the second via.

In S4210, a second passivation layer is formed on a side, distal from the base substrate, of the metal oxide layer.

Illustratively, the second passivation layer is a silicon nitride layer, and is formed on a side of the first source and drain metal layer by evaporating.

In S4211, a second source and drain metal layer is formed on a side, distal from the base substrate, of the second passivation layer.

Figure 34:
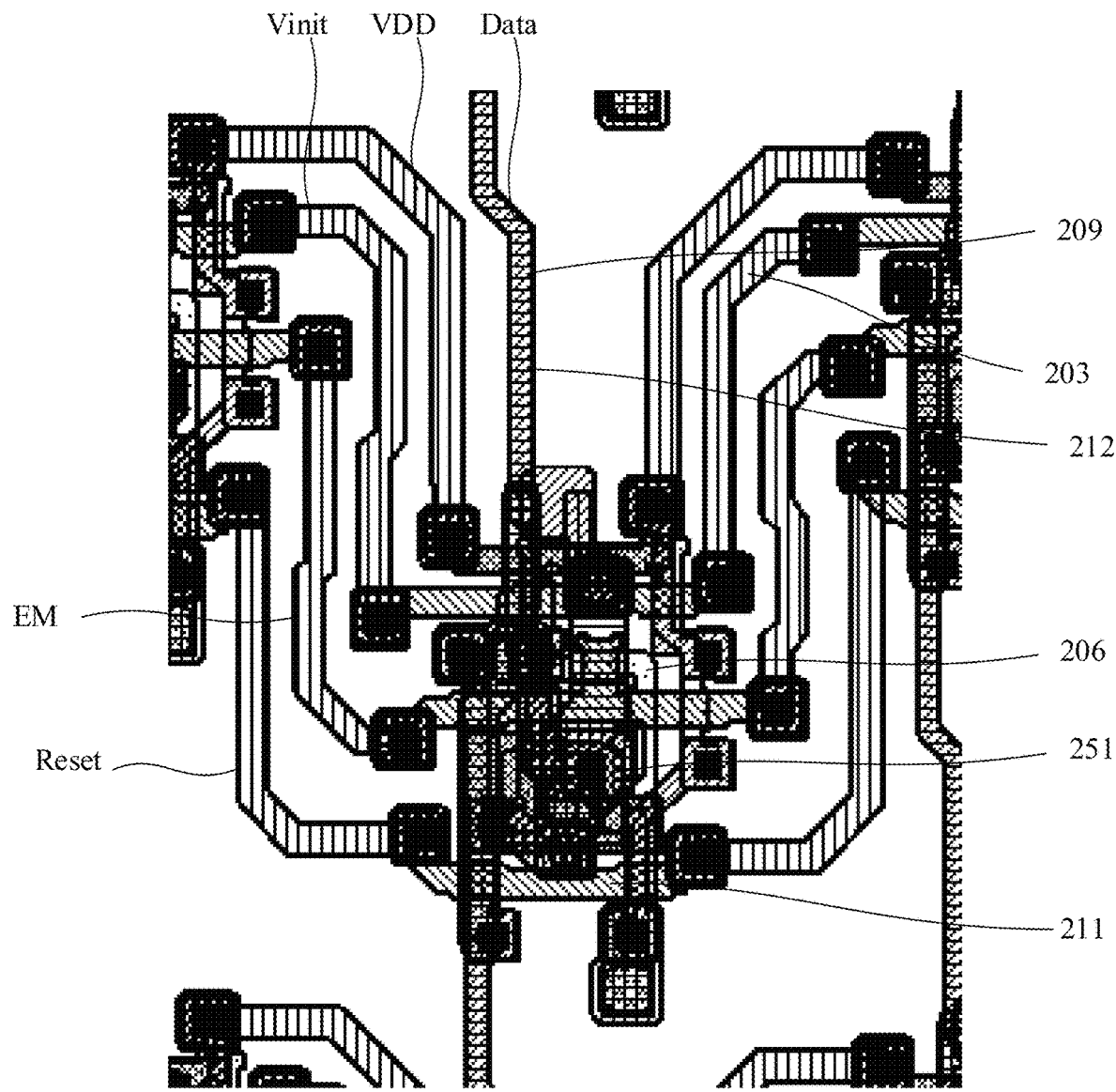
FIG. 34 is a flowchart of a method for manufacturing a display panel according to some embodiments of the present disclosure.

Illustratively, the second source and drain metal layer is a titanium metal layer. FIG. 34 is a flowchart of a method for manufacturing a display panel according to some embodiments of the present disclosure. Referring to FIG. 34, a second source and drain metal thin film is formed on a side of the second passivation layer by sputtering, and the second source and drain metal thin film is patterned by a patterning process to acquire the second source and drain metal layer 209. In FIG. 34, the second source and drain metal layer 209 blocks the first source and drain metal layer 212. A second portion of the power signal line is disposed in the second source and drain metal layer 209.

Eventually, other film layers, such as the planarization layer, the pixel defining layer, the light-emitting layer, and the package layer of the display panel are formed on the second source and drain metal layer, and the display panel is manufactured.

Figure 35:
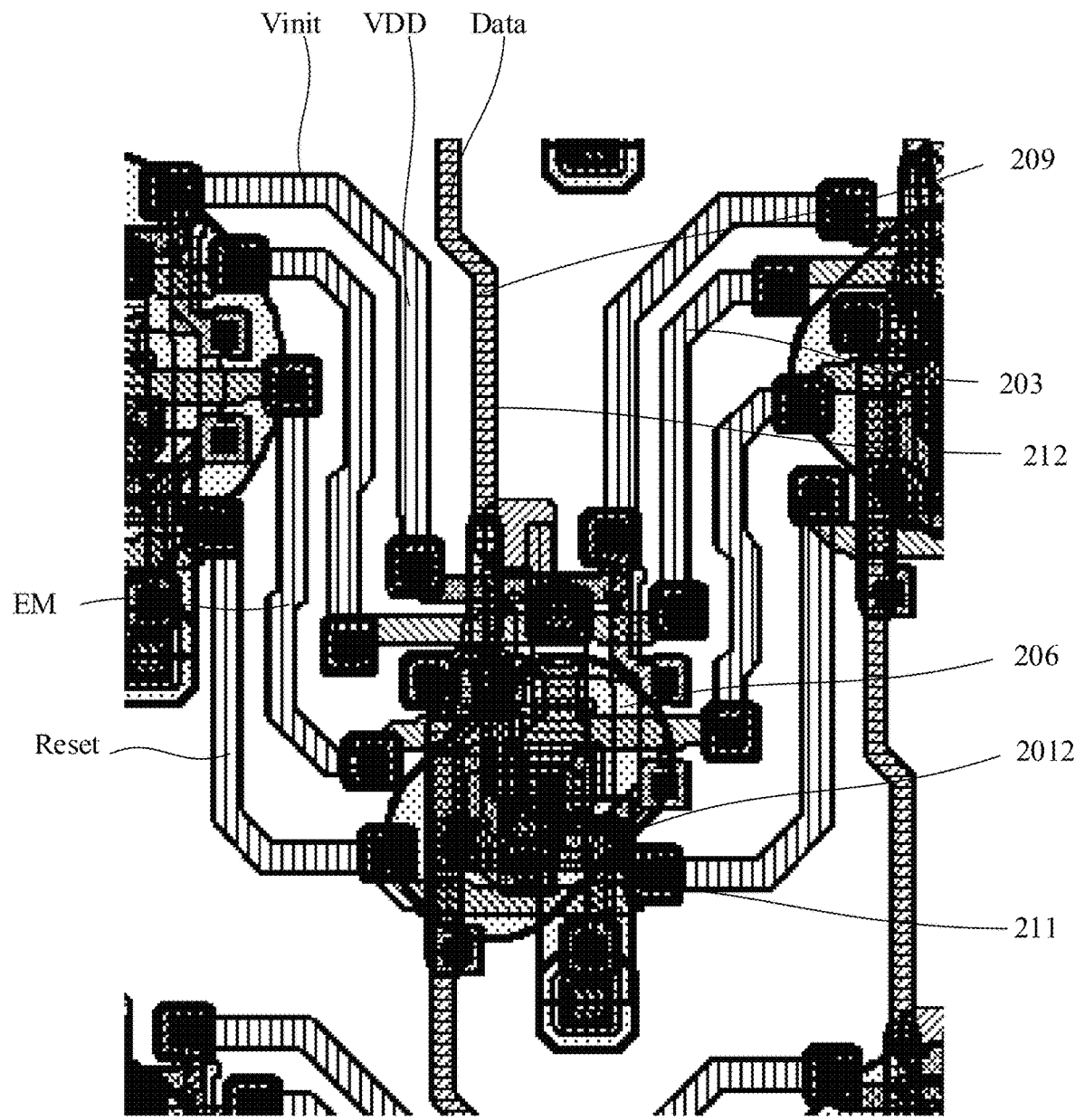
FIG. 35 is a flowchart of a method for manufacturing a display panel according to some embodiments of the present disclosure.

Illustratively, FIG. 35 is a flowchart of a method for manufacturing a display panel according to some embodiments of the present disclosure. Referring to FIG. 35, an anode layer 2012 is formed on the second source and drain metal layer 209.

It should be noted that for clear description of the manufacturing processes of the metal layer and the metal oxide layer, the manufacturing process of the insulative layer is omitted in the above manufacturing process.

The embodiments of the present disclosure further provide a display device. The display device includes a power supply assembly and the above display panel. The power supply assembly is configured to supply power to the display panel.

In some embodiments, the display device in the embodiments of the present disclosure is a mobile phone, a tablet computer, a television, a monitor, a laptop computer, a digital photo frame, a navigator, and any other product or component with a display function.

In some embodiments of the present disclosure, the display device further includes a photosensor. The photosensor is disposed on a side, distal from the plurality of first pixel units, of the display panel, and an orthogonal projection of the photosensor on the base substrate is at least partially overlapped with the first display region.

Described above are merely exemplary embodiments of the present disclosure, and are not intended to limit the present disclosure. Any modifications, equivalent substitutions, improvements, and the like within the spirit and principles of the disclosure are included in the scope of protection of the present disclosure.

The invention claimed is:

1. A display panel, comprising:
   a base substrate, comprising a display region and a periphery region at least partially surrounding the display region, wherein the display region comprises a first display region and a second display region disposed at least on one side of the first display region, a light transmittance of the first display region being greater than a light transmittance of the second display region;
   a plurality of first pixel units disposed on the base substrate and in the first display region; and
   a plurality of signal lines disposed at least in the first display region and electrically connected to the plurality of first pixel units, wherein the plurality of signal lines comprise a plurality of first signal lines and a plurality of second signal lines, wherein a first portion of each of the plurality of first signal lines is a metal signal line and is disposed at least in the first display region, and a first portion of each of the plurality of second signal lines is a metal oxide signal line and is disposed at least in the first display region,
   wherein at least one of the plurality of first signal lines further comprises a second portion in the second display region, and at least one of the plurality of second signal lines further comprises a second portion in the second display region, wherein both the second portion of at least one of the plurality of first signal lines and the second portion of at least one of the plurality of second signal lines are metal signal lines,
   the display panel further comprises: a first metal layer, a first insulative layer, and a metal oxide layer that are sequentially disposed on the base substrate in a direction away from the base substrate, wherein the plurality of first signal lines are disposed in the first metal layer, the first portion, in the first display region, of at least one of the plurality of second signal lines is disposed in the metal oxide layer the second portion, in the second display region of at least one of the plurality of second signal lines is disposed in the first metal layer, and the first portion and the second portion of the at least one of the plurality of second signal lines are connected by a first via opened through the first insulative layer, wherein the first via is at a junction of the first display region and the second display region.

2. The display panel according to claim 1, wherein the plurality of first signal lines comprise at least one of: a gate signal line, a data signal line, a reset signal line, a light-emitting control signal line, an initiation voltage signal line, and a power signal line.

3. The display panel according to claim 2, wherein the plurality of first signal lines comprise the gate signal line and the data signal line.

4. The display panel according to claim 1, wherein the first metal layer comprises a first gate metal layer and a first source and drain metal layer, and the first insulative layer comprises a first passivation layer and an inter-layer dielectric layer, wherein the first gate metal layer, the inter-layer dielectric layer, the first source and drain metal layer, and the first passivation layer are sequentially laminated in the direction away from the base substrate.

5. The display panel according to claim 1, further comprising: a second insulative layer and a second metal layer, wherein the second metal layer, the second insulative layer, the first metal layer, the first insulative layer, and the metal oxide layer are sequentially laminated in the direction away from the base substrate, the first portions, in the first display region, of another part of the plurality of second signal lines are disposed in the metal oxide layer, the second portions, in the second display region, of the another part of the plurality of second signal lines are disposed in the second metal layer, and the first portions and the second portions of the another part of the plurality of second signal lines are connected by a second via opened through the first insulative layer and the second insulative layer, wherein the second via is at the junction of the first display region and the second display region.

6. The display panel according to claim 5, wherein the second metal layer comprises a second gate metal layer, and the second insulative layer comprises a first gate insulative layer.

7. The display panel according to claim 1, wherein in a case that a ratio of a first size of the first display region to a second size of the first display region is greater than 2, the plurality of first signal lines are gate signal lines, wherein the first size of the first display region is a size of the first display region in an extension direction of the gate signal lines, and the second size of the first display region is a size of the first display region in an extension direction of data signal lines.

8. The display panel according to claim 1, wherein in a case that a ratio of a first size of the first display region to a second size of the first display region is less than 0.5, the plurality of first signal lines are data signal lines, wherein the first size of the first display region is a size of the first display region in an extension direction of gate signal lines, and the second size of the first display region is a size of the first display region in an extension direction of the data signal lines.

9. The display panel according to claim 1, wherein in a case that a ratio of a first size of the first display region to a second size of the first display region is in a range from 0.5 to 2, the plurality of first signal lines comprise a gate signal line and a data signal line, wherein the first size of the first display region is a size of the first display region in an extension direction of the gate signal line, and the second size of the first display region is a size of the first display region in an extension direction of the data signal line.

10. The display panel according to claim 1, further comprising: a plurality of second pixel units in the second display region, wherein the plurality of first pixel units and the plurality of second pixel units are arranged in a plurality of rows, pixel units in two adjacent rows of pixel units are staggered in an arrangement direction of one row of pixel units, and the pixel units in two adjacent rows of pixel units are connected by one gate signal line.

11. The display panel according to claim 10, wherein the gate signal line is wavy, and peaks of wave and valleys of wave of the gate signal line are respectively connected to the pixel units in adjacent two rows of pixel units.

12. The display panel according to claim 10, wherein the data signal line is wavy, and peaks of wave and valleys of wave of the data signal line are respectively connected to two adjacent pixel units in the same column of pixel units.

13. The display panel according to claim 1, wherein the metal signal line comprises a molybdenum-containing signal line and a titanium-containing signal line.

14. The display panel according to claim 1, wherein the metal oxide signal line is a transparent metal oxide signal line.

15. The display panel according to claim 14, wherein the metal oxide signal line is an indium tin oxide signal line.

16. A method for manufacturing a display panel, comprising:
providing a base substrate, wherein the base substrate comprises a display region and a periphery region at least partially surrounding the display region, wherein the display region comprises a first display region and a second display region disposed at least on one side of the first display region, a light transmittance of the first display region being greater than a light transmittance of the second display region; and
forming a plurality of first pixel units and a plurality of signal lines on the base substrate, wherein the plurality of first pixel units are disposed in the first display region, the plurality of signal lines are disposed at least in the first display region and electrically connected to the plurality of first pixel units, and the plurality of signal lines comprise a plurality of first signal lines and a plurality of second signal lines, wherein a first portion of each of the plurality of first signal lines is a metal signal line and is disposed at least in the first display region, and a first portion of each of the plurality of second signal lines is a metal oxide signal line and is disposed at least in the first display region,
wherein at least one of the plurality of first signal lines further comprises a second portion in the second display region, and at least one of the plurality of second signal lines further comprises a second portion in the second display region, wherein both the second portion of at least one of the plurality of first signal lines and the second portion of at least one of the plurality of second signal lines are metal signal lines,
the display panel further comprises: a first metal layer, a first insulative layer, and a metal oxide layer that are sequentially disposed on the base substrate in a direction away from the base substrate, wherein the plurality of first signal lines are disposed in the first metal layer, the first portion, in the first display region, of at least one of the plurality of second signal lines is disposed in the metal oxide layer, the second portion, in the second display region, of at least one of the plurality of second signal lines is disposed in the first metal layer, and the first portion and the second portion of the at least one of the plurality of second signal lines are connected by a first via opened through the first insulative layer, wherein the first via is at a junction of the first display region and the second display region.

17. A display device, comprising: a power supply assembly and a display panel, wherein
the display panel comprises:
a base substrate, comprising a display region and a periphery region at least partially surrounding the display region, wherein the display region comprises a first display region and a second display region disposed at least on one side of the first display region, a light transmittance of the first display region being greater than a light transmittance of the second display region;

a plurality of first pixel units disposed on the base substrate and in the first display region; and a plurality of signal lines disposed at least in the first display region and electrically connected to the plurality of first pixel units, wherein the plurality of signal lines comprise a plurality of first signal lines and a plurality of second signal lines, wherein a first portion of each of the plurality of first signal lines is a metal signal line and is disposed at least in the first display region, and a first portion of each of the plurality of second signal lines is a metal oxide signal line and is disposed at least in the first display region;

and the power supply assembly is configured to supply power to the display panel, wherein at least one of the plurality of first signal lines further comprises a second portion in the second display region, and at least one of the plurality of second signal lines further comprises a second portion in the second display region, wherein both the second portion of at least one of the plurality of first signal lines and the second portion of at least one of the plurality of second signal lines are metal signal lines, the display panel further comprises: a first metal layer, a first insulative layer, and a metal oxide layer that are sequentially disposed on the base substrate in a direction away from the base substrate, wherein the plurality of first signal lines are disposed in the first metal layer, the first portion, in the first display region, of at least one of the plurality of second signal lines is disposed in the metal oxide layer, the second portion, in the second display region, of at least one of the plurality of second signal lines is disposed in the first metal layer, and the first portion and the second portion of the at least one of the plurality of second signal lines are connected by a first via opened through the first insulative layer, wherein the first via is at a junction of the first display region and the second display region.

18. The display device according to claim 17, further comprising: a photosensor, wherein the photosensor is disposed on a side, distal from the plurality of first pixel units, of the display panel, and an orthogonal projection of the photosensor on the base substrate is at least partially overlapped with the first display region.

* * * * *